(12) United States Patent
Segawa et al.

(10) Patent No.: US 9,013,345 B2
(45) Date of Patent: Apr. 21, 2015

(54) SUCCESSIVE APPROXIMATION AD CONVERTER AND SUCCESSIVE APPROXIMATION AD CONVERSION METHOD

(71) Applicants: Tomoki Segawa, Tokyo (JP); Fumihiro Inoue, Tokyo (JP)

(72) Inventors: Tomoki Segawa, Tokyo (JP); Fumihiro Inoue, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 14/161,790

(22) Filed: Jan. 23, 2014

(65) Prior Publication Data
US 2014/0210654 A1 Jul. 31, 2014

(30) Foreign Application Priority Data
Jan. 25, 2013 (JP) .................................. 2013-012146

(51) Int. Cl.
*H03M 1/12* (2006.01)
*H03M 1/06* (2006.01)
*H03M 1/40* (2006.01)

(52) U.S. Cl.
CPC .............. *H03M 1/1245* (2013.01); *H03M 1/40* (2013.01); *H03M 1/0687* (2013.01); *H03M 1/0697* (2013.01)

(58) Field of Classification Search
CPC . H03M 1/0675; H03M 1/069; H03M 1/0695; H03M 1/38; H03M 1/40; H03M 1/42; H03M 1/44; H03M 1/46

USPC .................................................. 341/161–163
See application file for complete search history.

(56) References Cited

U.S. PATENT DOCUMENTS

| | | | | |
|---|---|---|---|---|
| 5,057,841 | A * | 10/1991 | Veerhoek et al. | 341/163 |
| 6,452,528 | B1 * | 9/2002 | Mansoorian | 341/162 |
| 8,599,059 | B1 * | 12/2013 | Chung et al. | 341/163 |
| 8,902,092 | B2 * | 12/2014 | Haneda | 341/118 |
| 2002/0003487 | A1 * | 1/2002 | Harada et al. | 341/163 |
| 2011/0133971 | A1 | 6/2011 | Ogawa et al. | |
| 2012/0026023 | A1 | 2/2012 | Inoue | |

FOREIGN PATENT DOCUMENTS

| | | |
|---|---|---|
| JP | 2010-245927 | 10/2010 |
| JP | 2011-120011 | 6/2011 |

* cited by examiner

*Primary Examiner* — Howard Williams
(74) *Attorney, Agent, or Firm* — IPUSA, PLLC

(57) ABSTRACT

A successive approximation AD converter includes a DA converter that converts a higher conversion data greater than an approximate value into an analog higher converted voltage and converts a lower conversion data less than the approximate value into an analog lower converted voltage; a sample-and-hold circuit that samples and holds voltage differences between an input voltage and each of the higher converted voltage and the lower converted voltage; a comparator that outputs a first comparison result indicating whether the input voltage is greater or less than the higher converted voltage and a second comparison result indicating whether the input voltage is greater or less than the lower converted voltage; and an operation unit that changes the approximate value based on the first comparison result and the second comparison result, and changes a next higher conversion data and a next lower conversion data based on the changed approximate value.

10 Claims, 23 Drawing Sheets

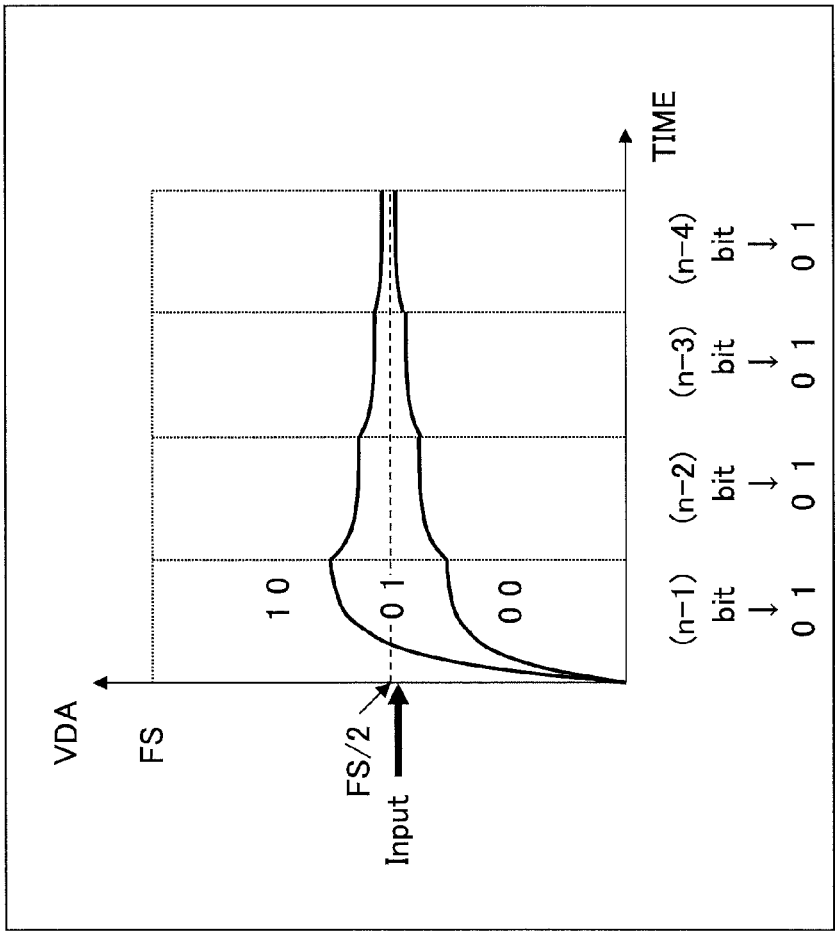

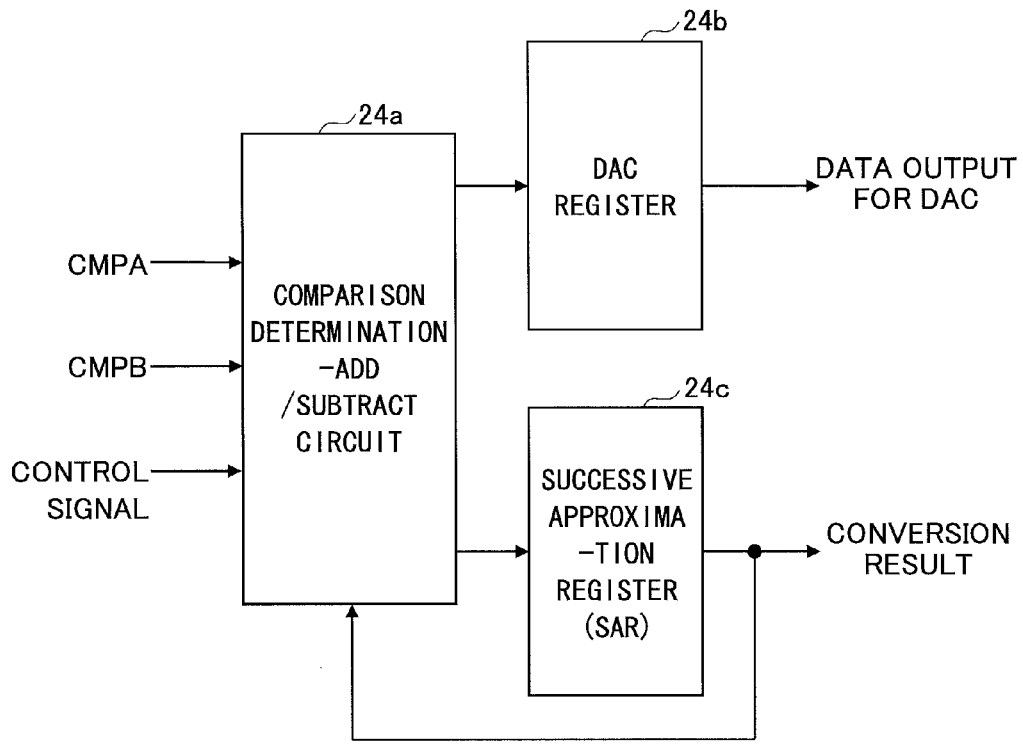

| i | $SAR_i$ | DAC REGISTER | | $\Delta SAR_i$ |
|---|---|---|---|---|
| | | $DACL_i$ | $DACH_i$ | |
| 1 | $SAR_1$ | $SAR_1 - 2^{(n-3)}$ | $SAR_1 + 2^{(n-3)}$ | $2^{(n-2)}$ |
| 2 | $SAR_2$ | $SAR_2 - 2^{(n-4)}$ | $SAR_2 + 2^{(n-4)}$ | $2^{(n-3)}$ |
| 3 | $SAR_3$ | $SAR_3 - 2^{(n-5)}$ | $SAR_3 + 2^{(n-5)}$ | $2^{(n-4)}$ |
| 4 | $SAR_4$ | $SAR_4 - 2^{(n-6)}$ | $SAR_4 + 2^{(n-6)}$ | $2^{(n-5)}$ |
| 5 | $SAR_5$ | $SAR_5 - 2^{(n-7)}$ | $SAR_5 + 2^{(n-7)}$ | $2^{(n-6)}$ |
| 6 | $SAR_6$ | $SAR_6 - 2^{(n-8)}$ | $SAR_6 + 2^{(n-8)}$ | $2^{(n-7)}$ |
| 7 | $SAR_7$ | $SAR_7 - 2^{(n-9)}$ | $SAR_7 + 2^{(n-9)}$ | $2^{(n-8)}$ |
| 8 | $SAR_8$ | $SAR_8 - 2^{(n-10)}$ | $SAR_8 + 2^{(n-10)}$ | $2^{(n-9)}$ |
| 9 | $SAR_9$ | $SAR_9 - 2^{(n-11)}$ | $SAR_9 + 2^{(n-11)}$ | $2^{(n-10)}$ |
| 10 | $SAR_{10}$ | $SAR_{10} - 2^{(n-12)}$ | $SAR_{10} + 2^{(n-12)}$ | $2^{(n-11)}$ |
| 11 | $SAR_{11}$ | $SAR_{11} - 2^{(n-12)}$ | $SAR_{11} + 2^{(n-12)}$ | $2^{(n-12)}$ |
| 12 | $SAR_{12}$ | $SAR_{12}$ | | $2^{(n-12)}$ |

FIG.7

| CMPA$_i$ | CMPB$_i$ | ORDER$_i$ | DAC REGISTER VALUES FOR COMPARISON | | ORDER$_{(i+1)}$ |
|---|---|---|---|---|---|
| | | | DACA$_{(i+1)}$ | DACB$_{(i+1)}$ | |
| 0 | 0 | 0 | DACH$_{(i+1)}$ | DACL$_{(i+1)}$ | 0 |
| 0 | 1 | 0 | DACL$_{(i+1)}$ | DACL$_{(i+1)}$ | 1 |
| 1 | 0 | 0 | DACL$_{(i+1)}$ | DACH$_{(i+1)}$ | 1 |
| 1 | 1 | 0 | DACL$_{(i+1)}$ | DACH$_{(i+1)}$ | 1 |
| 0 | 0 | 1 | DACH$_{(i+1)}$ | DACH$_{(i+1)}$ | 0 |
| 0 | 1 | 1 | DACH$_{(i+1)}$ | DACL$_{(i+1)}$ | 0 |
| 1 | 0 | 1 | DACH$_{(i+1)}$ | DACL$_{(i+1)}$ | 0 |
| 1 | 1 | 1 | DACL$_{(i+1)}$ | DACH$_{(i+1)}$ | 1 |

FIG.12

| STEP | SETTLING TIME [τ] | DETERMINATION COUNT | CONVERSION TIME [τ] |
|---|---|---|---|
| DUMMY | 8.9 | 1 | 8.9 |
| 1 | 8.9 | 1 | 8.9 |
| 2 | 8.9 | 1 | 8.9 |
| 3 | 8.5 | 1 | 8.5 |
| 4 | 8.2 | 1 | 8.2 |
| 5 | 7.3 | 1 | 7.3 |
| 6 | 6.5 | 1 | 6.5 |
| 7 | 6.0 | 1 | 6.0 |
| 8 | 5.5 | 1 | 5.5 |
| 9 | 5.0 | 1 | 5.0 |
| 10 | 4.5 | 1 | 4.5 |
| 11 | 4.2 | 1 | 4.2 |
| 12 | 3.7 | 1 | 3.7 |
| TOTAL | | 13 | 86.1 |

FIG.13

| STEP | SETTLING TIME [$\tau$] | DETERMINATION COUNT | CONVERSION TIME [$\tau$] |
|---|---|---|---|
| DUMMY | 1.2 | 2 | 2.4 |
| 1 | 1.2 | 2 | 2.4 |
| 2 | 1.9 | 2 | 3.8 |
| 3 | 1.9 | 2 | 3.8 |
| 4 | 2.0 | 2 | 4.0 |
| 5 | 1.9 | 2 | 3.8 |
| 6 | 1.9 | 2 | 3.8 |
| 7 | 1.9 | 2 | 3.8 |
| 8 | 1.9 | 2 | 3.8 |
| 9 | 1.9 | 2 | 3.8 |
| 10 | 1.9 | 2 | 3.8 |
| 11 | 1.8 | 2 | 3.6 |
| 12 | 4.4 | 1 | 4.4 |
| TOTAL | | 25 | 47.2 |

SUCCESSIVE APPROXIMATION AD CONVERTER AND SUCCESSIVE APPROXIMATION AD CONVERSION METHOD

CROSS-REFERENCE TO RELATED APPLICATION

The present application is based upon and claims the benefit of priority of Japanese Patent Application No. 2013-012146, filed on Jan. 25, 2013, the entire contents of which are incorporated herein by reference.

BACKGROUND OF THE INVENTION

1. Field of the Invention

An aspect of this disclosure relates to a successive approximation AD converter and a successive approximation AD conversion method.

2. Description of the Related Art

A microprocessor is generally provided in a portable electronic apparatus such as a cell phone, a personal digital assistant (PDA), or a digital camera to control a system in the electronic apparatus. For example, the microprocessor monitors and controls the temperature of the electronic apparatus and the voltage of a battery in the electronic apparatus. For this purpose, an electronic apparatus generally includes sensors for detecting its temperature and a battery voltage, and a microprocessor of the electronic apparatus typically includes an analog-to-digital (AD) converter for converting analog signals output from the sensors into digital signals. An AD converter to be included in a microprocessor preferably has a small circuit size. An example of such an AD converter is a successive approximation AD converter.

FIG. 18 is a circuit diagram illustrating a configuration of a related-art successive approximation AD converter. In FIG. 18, an analog voltage Vin is input to an input terminal 10. A sample-and-hold circuit 11 samples and holds a voltage difference between the analog voltage Vin and an output voltage of a digital-to-analog (DA) converter 14 with reference to a reference voltage Vref.

A dynamic latch comparator 12 compares an output voltage of the sample-and-hold circuit 11 with the reference voltage Vref and supplies the comparison result, which indicates whether the analog voltage Vin is greater or less than the output voltage of the DA converter 14, to a successive approximation register and operation unit 13. The successive approximation register and operation unit 13 generates next (or subsequent) DA conversion data (data to be converted in the next DA conversion process) based on the comparison result supplied from the dynamic latch comparator 12, and supplies the generated data to the DA converter 14. The successive approximation register and operation unit 13 also supplies digital data, which is a final conversion result, to an output circuit 16.

A control circuit 15 receives a clock signal and a conversion start command, generates timing signals φ1, φ2, and φ3, supplies the timing signals φ1, φ2, and φ3 to the sample-and-hold circuit 11 and the dynamic latch comparator 12, generates a control signal indicating a start or an end, and supplies the control signal to the successive approximation register and operation unit 13. The output circuit 16 outputs the digital data that is the final conversion result.

First, the timing signal φ1 is set at 1 and the timing signal φ2 is set at 0 to turn on switches SW1 and SW3 and turn off a switch SW2 of the sample-and-hold circuit 11. As a result, a charge corresponding to (Vref−Vin) is stored in a capacitor C1 of the sample-and-hold circuit 11.

Next, a DAC voltage $V_{DAC}$ is output from the DA converter 14, and the timing signal φ1 is set at 0 and the timing signal φ2 is set at 1 to turn off the switches SW1 and SW3 and turn on the switch SW2 of the sample-and-hold circuit 11. As a result, a voltage $V_A$ at a terminal of the capacitor C1 on the side of a differential amplifier 11a becomes $V_A$=Vref+($V_{DAC}$−Vin). The voltage $V_A$ indicates a voltage difference between the DAC voltage $V_{DAC}$ and the input voltage Vin with reference to the reference voltage Vref. The successive approximation register and operation unit 13 generates next DA conversion data based on the comparison result supplied from the dynamic latch comparator 12. The above-described successive approximation process is repeated from the most significant bit (MSB) to the least significant bit (LSB) of DA conversion data (data to be converted from analog to digital) to generate digital data that is the final conversion result.

Japanese Laid-Open Patent Publication No. 2010-245927 discloses a successive approximation AD conversion circuit including a comparison circuit for comparing an input analog voltage and a comparison voltage. The comparison circuit includes an initial amplifier stage that is used in common, a first comparison unit including a first amplifier stage connected via a coupling capacitor to the initial amplifier stage, a second comparison unit including a second amplifier stage connected via a coupling capacitor to the initial amplifier stage, a first comparison point shift circuit connected to an input terminal of the first amplifier stage, and a second comparison point shift circuit connected to an input terminal of the second amplifier stage. The first comparison point shift circuit and the second comparison point shift circuit shift the comparison voltage for a predetermined amount in opposite directions when amplifying a potential difference between the input analog voltage and the comparison voltage.

Japanese Laid-Open Patent Publication No. 2011-120011 discloses an analog-digital converter including a DAC that outputs a reference analog signal corresponding to a multi-bit digital signal, first and second comparators that compare an input analog signal Vin with the reference analog signal, a selection circuit that selects one of the comparison results of the first and second comparators, and a control circuit that sequentially changes the multi-bit digital signal in multiple steps based on the selected comparison result such that the reference analog signal becomes close to the input analog signal. The control circuit controls the selection circuit to select the comparison result of the first comparator in steps up to a middle step and select the comparison result of the second comparator in steps following the middle step, and thereby changes bit values of the multi-bit digital signal according to a non-binary algorithm.

With the related-art configuration of FIG. 18, however, the successive approximation AD converter requires a long settling time that is the time from when the DA converter 14 starts outputting the DAC voltage $V_{DAC}$ until when the voltage $V_A$ of the terminal of the capacitor C1 on the side of the differential amplifier 11a becomes stable at $V_A$=Vref+($V_{DAC}$−Vin) and the dynamic latch comparator 12 becomes able to output correct comparison results. Accordingly, the related-art successive approximation AD converter requires a long conversion time.

Also, the successive approximation AD conversion circuit of Japanese Laid-Open Patent Publication No. 2010-245927 requires two comparison units, i.e., the first comparison unit and the second comparison unit. With this configuration, it is troublesome to adjust the two comparison units to make their comparison characteristics the same.

SUMMARY OF THE INVENTION

In an aspect of this disclosure, there is provided a successive approximation AD converter including a DA converter that converts a higher conversion data greater than an approximate value into an analog higher converted voltage and converts a lower conversion data less than the approximate value into an analog lower converted voltage; a sample-and-hold circuit that samples and holds voltage differences between an input voltage input from an outside and each of the higher converted voltage and the lower converted voltage; a comparator that outputs, based on the voltage differences output from the sample-and-hold circuit, a first comparison result indicating whether the input voltage is greater or less than the higher converted voltage and a second comparison result indicating whether the input voltage is greater or less than the lower converted voltage; and an operation unit that changes the approximate value based on the first comparison result and the second comparison result, changes a next higher conversion data and a next lower conversion data based on the changed approximate value, and outputs the changed next higher conversion data and next lower conversion data to the DA converter. The successive approximation AD converter is configured such that operations of the DA converter, the sample-and-hold circuit, the comparator, and the operation unit are repeated to obtain a final approximate value that is output as AD converted data. The operation unit determines a next order in which the next higher conversion data and the next lower conversion data are output to the DA converter based on the first comparison result, the second comparison result, and a previous order in which the higher conversion data and the lower conversion data have been output.

BRIEF DESCRIPTION OF THE DRAWINGS

FIG. 4A is a graph illustrating variation of an exemplary output voltage of a DA converter;

FIG. 4B is a drawing used to describe an exemplary operation of codes;

FIG. 5 is a circuit diagram illustrating an exemplary configuration of a successive approximation register and operation unit;

FIG. 6 is a table illustrating a relationship among approximate values, DA conversion data, and increments;

FIG. 7 is a table illustrating comparison data corresponding to comparison results and orders;

FIG. 12 is a table illustrating simulation results of conversion time according to the related-art;

FIG. 13 is a table illustrating simulation results of conversion time according to an embodiment;

DESCRIPTION OF THE PREFERRED EMBODIMENTS

Preferred embodiments of the present invention are described below with reference to the accompanying drawings.

<Circuit Configuration>

Figure 1:
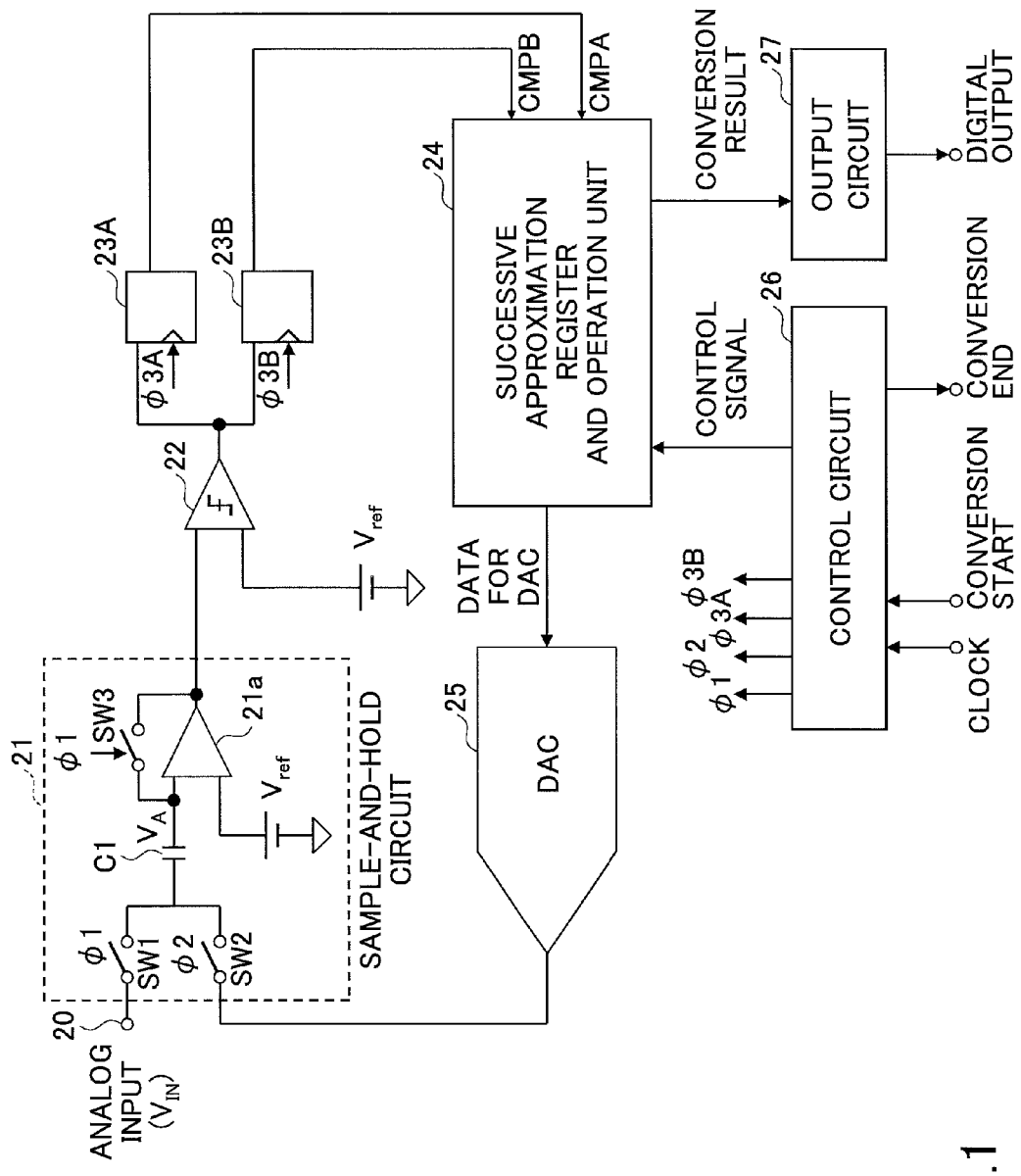
FIG. 1 is a circuit diagram illustrating an exemplary configuration of a successive approximation AD converter according to an embodiment.

FIG. 1 is a circuit diagram illustrating an exemplary configuration of a successive approximation analog-to-digital (AD) converter according to an embodiment. In FIG. 1, an analog voltage Vin is input to an input terminal 20. A sample-and-hold circuit 21 samples and holds the analog voltage Vin or a voltage difference between the analog voltage Vin and an output voltage of a digital-to-analog (DA) converter 25 with reference to a reference voltage Vref.

A comparator 22 is, for example, a dynamic latch comparator and has a hysteresis characteristic. The comparator 22 compares an output voltage of the sample-and-hold circuit 21 with the reference voltage Vref and supplies the comparison result to latch circuits 23A and 23B. The comparison result becomes 1 when the voltage difference between the analog voltage Vin and the output voltage of the DA converter 25 is greater than the reference voltage Vref, and becomes 0 when the voltage difference is less than the reference voltage Vref. In other words, the comparison result indicates whether the analog voltage Vin is greater or less than the output voltage of the DA converter 25. The comparison result becomes 1 when the analog voltage Vin is greater than the output voltage of the DA converter 25, and becomes 0 when the analog voltage Vin is less than the output voltage of the DA converter 25. The connection between the sample-and-hold circuit 21 and the comparator 22 may be configured to transmit a differential signal.

The latch circuit 23A latches a comparison result (CMPA) and supplies the latched comparison result to a successive approximation register and operation unit 24 when the value of a timing signal φ3A is 1 (high level). The latch circuit 23B latches a comparison result (CMPB) and supplies the latched comparison result to the successive approximation register and operation unit 24 when the value of a timing signal φ3B is 1 (high level).

The successive approximation register and operation unit 24 determines the corresponding bit based on the comparison results supplied from the latch circuits 23A and 23B, generates next (or subsequent) DA conversion data (data to be converted in the next DA conversion process), supplies the next DA conversion data as comparison data to the DA converter 25, and supplies a final conversion result to an output circuit 27.

A control circuit 26 receives a clock signal and a conversion start command from the outside, generates timing signals φ1, φ2, φ3A, and φ3B, supplies the timing signals φ1, φ2, φ3A, and φ3B to the sample-and-hold circuit 21 and the latch circuits 23A and 23B, generates a control signal indicating a start or an end, and supplies the control signal to the successive approximation register and operation unit 24. The control circuit 26 also outputs a conversion end command to the outside. The output circuit 27 outputs digital data that is the final conversion result (final approximate value) to the outside.

Figure 2:
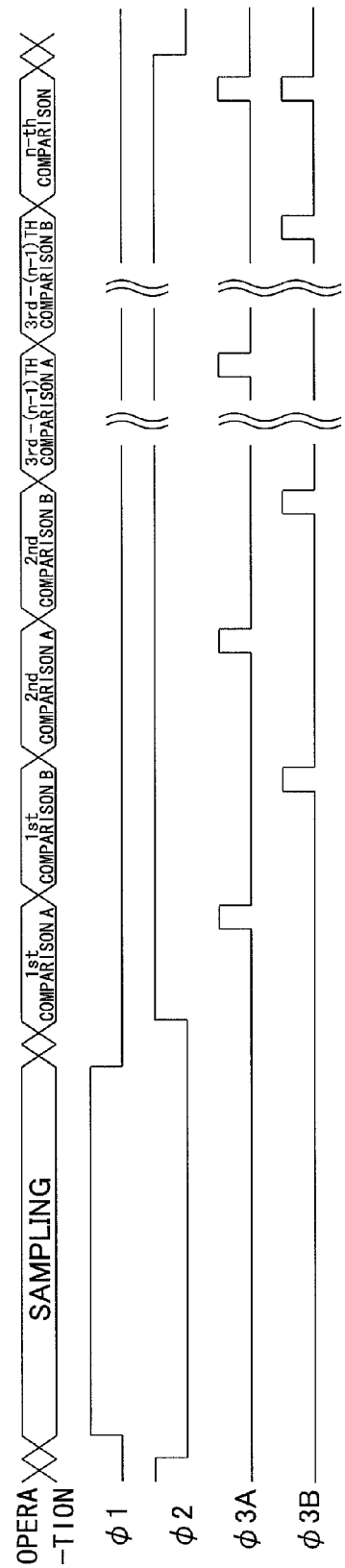
FIG. 2 is a timing chart of signals output from components of the successive approximation AD converter of FIG. 1.

The timing signal φ1 is set at 1 (high level) and the timing signal φ2 is set at 0 (low level) at the timing of a sampling operation in FIG. 2 to turn on switches SW1 and SW3 and turn off a switch SW2 of the sample-and-hold circuit 21. As a result, a charge corresponding to (Vref−Vin) is stored in a capacitor C1 of the sample-and-hold circuit 21.

Next, at the timing of a first comparison operation A in FIG. 2, a DAC voltage $V_{DACA}$ is output from the DA converter 25, and the timing signal φ1 is set at 0 and the timing signal φ2 is set at 1 to turn off the switches SW1 and SW3 and turn on the switch SW2 of the sample-and-hold circuit 21. As a result, a voltage $V_A$ at a terminal of the capacitor C1 on the side of a differential amplifier 21a becomes $V_{AA}$=Vref+($V_{DACA}$−Vin). In this case, the voltage $V_A$ indicates a voltage difference between the DAC voltage $V_{DACA}$ and the input voltage Vin with reference to the reference voltage Vref. The latch circuit 23A latches a comparison result that is supplied from the comparator 22 at a timing when the timing signal φ3A is 1, and supplies the latched comparison result to the successive approximation register and operation unit 24.

Next, at the timing of a first comparison operation B in FIG. 2, a DAC voltage $V_{DACB}$ is output from the DA converter 25, and the timing signal φ1 is set at 0 and the timing signal φ2 is set at 1 to turn off the switches SW1 and SW3 and turn on the switch SW2 of the sample-and-hold circuit 21. As a result, the voltage $V_A$ at the terminal of the capacitor C1 on the side of the differential amplifier 21a becomes $V_{AB}$=Vref+($V_{DACB}$−Vin). In this case, the voltage $V_A$ indicates a voltage difference between the DAC voltage $V_{DACB}$ and the input voltage Vin with reference to the reference voltage Vref. The latch circuit 23B latches a comparison result that is supplied from the comparator 22 at a timing when the timing signal φ3B is 1, and supplies the latched comparison result to the successive approximation register and operation unit 24. Second and succeeding comparison operations A and B are performed in a similar manner.

Figure 3:
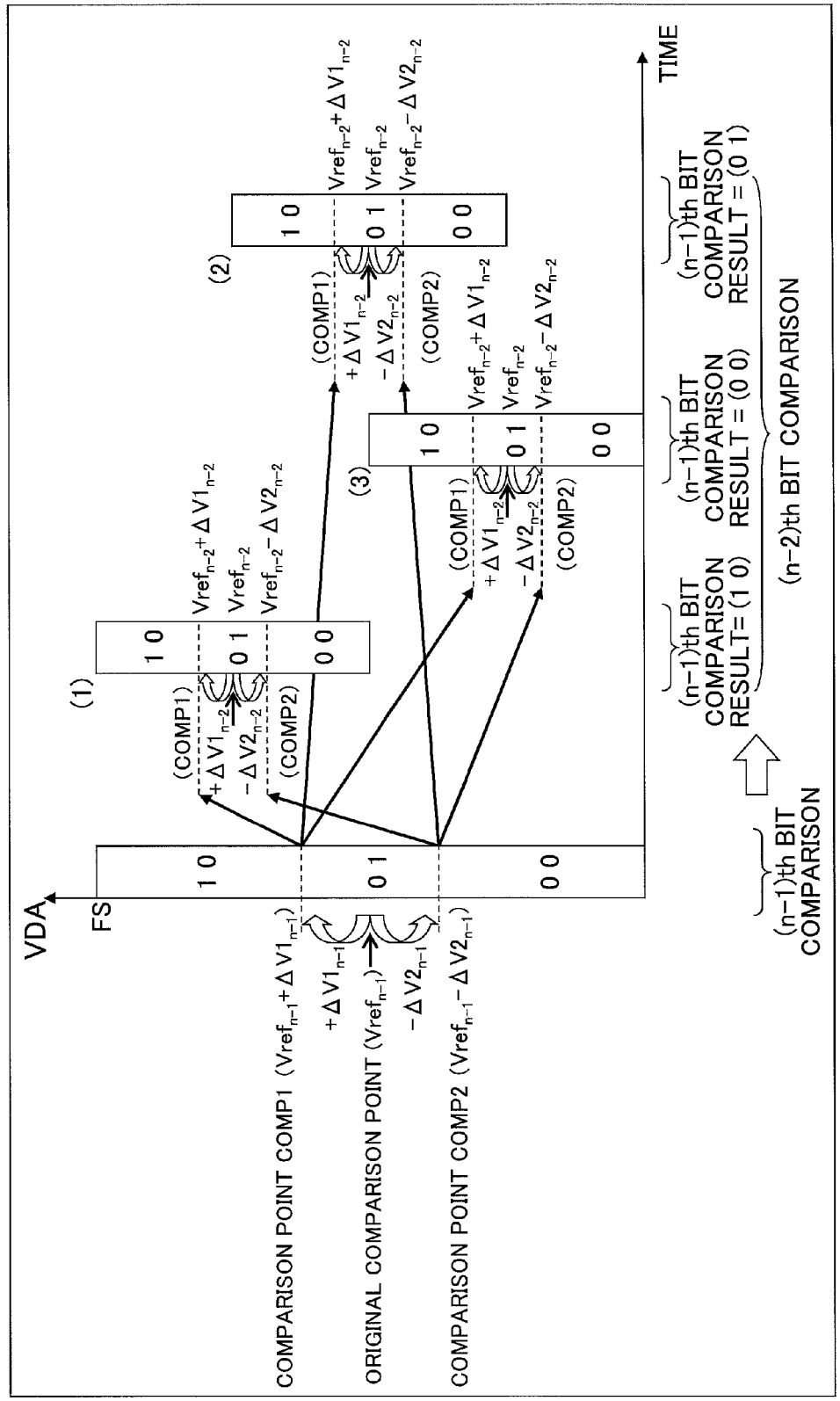
FIG. 3 is a drawing used to describe exemplary operations of the successive approximation AD converter of FIG. 1.

FIG. 3 is a drawing used to describe exemplary operations of the successive approximation AD converter of the present embodiment. FIG. 3 illustrates a comparison operation for a (n−1)th bit and a comparison operation for a (n−2)th bit. In the present embodiment, an original comparison point is used as a reference point, and two comparison points are set at positions shifted upward and downward from the original comparison point. The comparison points are set such that a shift amount $\Delta V$ from the original comparison point becomes smaller as the number of performed comparison operations increases. Instead of decreasing the shift amount $\Delta V$ each time, the shift amount $\Delta V$ may be set such that $\Delta V \leq FS/2^n \times 2^{(k-2)}$ is satisfied at a comparison operation for a k-th bit and the same shift amount $\Delta V$ may be used throughout the process. Also, the shift amount $\Delta V$ may be decreased at intervals. In FIG. 3, FS indicates a potential difference between the upper limit and the lower limit of a full scale range (FSR) indicating a range of voltages that can be converted from analog to digital.

Comparison results are represented by three types of codes (1, 0), (0, 1), and (0, 0) according to input voltage ranges. Code (1, 0) indicates that the outputs from the latch circuits 23A and 23B are "1, 1". Code (0, 1) indicates that the outputs from the latch circuits 23A and 23B are "0, 1". Code (0, 0) indicates that the outputs from the latch circuits 23A and 23B are "0, 0".

In the comparison operation for the (n−2)th bit, the comparison points are shifted according to a code indicating the comparison result of the (n−1)th bit. When the comparison result of the (n−1)th bit is (1, 0), both of the comparison points are shifted to higher positions as indicated by (1) in FIG. 3. When the comparison result of the (n−1)th bit is (0, 1), the comparison points are shifted such that they come closer to each other as indicated by (2) in FIG. 3. When the comparison result of the (n−1)th bit is (0, 0), both of the comparison points are shifted to lower positions as indicated by (3) in FIG. 3. Thus, according to the comparison result (code) of the previous comparison operation, the next comparison operation is performed in one of the ranges indicated by (1), (2), and (3) in FIG. 3. With the above process, redundant determination is performed using a shift amount $\Delta V$ between the two comparison points as a redundant determination range.

FIG. 4A is a graph illustrating variation of an exemplary output voltage of the DA converter 25 performing an AD conversion process according to the above described method. With the present embodiment where two comparison points are set at positions shifted upward and downward from the original comparison point, determination errors at higher-order bits are less likely to occur and accurate final conversion results can be obtained when the potential of the input voltage Vin is close to the original comparison point as illustrated by FIG. 4A.

Results (three types of 2-bit codes) obtained by repeating comparison operations as described above are added by the successive approximation register and operation unit 24. In the example of FIG. 4B, the successive approximation register and operation unit 24 shifts the results by one digit from each other, adds the shifted results, and truncates the least significant bit to obtain an AD conversion result. Instead of being truncated, the least significant bit may be rounded up.

FIG. 5 is a circuit diagram illustrating an exemplary configuration of the successive approximation register and operation unit 24. As illustrated by FIG. 5, the successive approximation register and operation unit includes a comparison determination-add/subtract circuit 24a, a DAC register 24b, and a successive approximation register (SAR) 24c. The comparison determination-add/subtract circuit 24a determines an approximate value $SAR_i$ based on the comparison results CMPA and CMPB supplied from the latch circuits 23A and 23B, and generates DA conversion data $DACL_i$ and $DACH_i$ for obtaining a next approximate value $SAR_{i+1}$ by performing an addition/subtraction process on the determined approximate value $SAR_i$. $DACL_i$ indicates lower (or smaller) DA conversion data, and $DACH_i$ indicates higher (or larger) DA conversion data.

The comparison determination-add/subtract circuit 24a stores the DA conversion data $DACL_i$ and $DACH_i$ for the next bit in the DAC register 24b, and stores the approximate value $SAR_i$ in the successive approximation register 24c. The DA conversion data $DACL_i$ and $DACH_i$ are read sequentially from the DAC register 24b and supplied to the DA converter 25. The approximate value $SAR_i$ read from the successive approximation register 24c is supplied to the comparison determination-add/subtract circuit 24a to perform the addition/subtraction process to obtain the next approximate value $SAR_{i+1}$. Also, all bits of digital data, i.e., a conversion result, are supplied from the successive approximation register 24c to the output circuit 27.

An exemplary process performed by the successive approximation register and operation unit 24 is described below. In the exemplary process, it is assumed that the analog voltage Vin is converted into 12-bit digital data.

FIG. 6 is a table illustrating a relationship among approximate values $SAR_i$, DA conversion data $DACL_i$ and $DACH_i$, and increments $\Delta SAR_i$. In FIG. 6, $SAR_1$ is $2^{11}=2048$, $DACL_1$ is $SAR_1-2^{(n-3)}=SAR_1-2^9$, and $DACH_1$ is $SAR_1+2^{(n-3)}=SAR_1+2^9$. Similarly, $DACL_2$ is $SAR_2-2^{(n-4)}=SAR_2-2^8$, and $DACH_2$ is $SAR_2+2^{(n-4)}=SAR_2+2^8$.

In the example of FIG. 6, the amount of change from the approximate value $SAR_2$ to each of the lower conversion data $DACL_2$ and the higher conversion data $DACH_2$ is one half ($\pm 2^8$) of the amount of change ($\pm 2^9$) from the approximate value $SAR_1$ to the approximate value $SAR_2$. However, the amount of change from the approximate value $SAR_2$ to each of the lower conversion data $DACL_2$ and the higher conversion data $DACH_2$ may be set at any value that is less than or equal to one half ($\pm 2^8$) of the amount of change ($\pm 2^9$) from the approximate value $SAR_1$ to the approximate value $SAR_2$.

FIG. 7 is a table illustrating comparison data $DACA_{(i+1)}$ and $DACB_{(i+1)}$ that are to be stored in the DAC register 24b and correspond to comparison results $CMPA_i$ and $CMPB_i$ and orders $ORDER_i$. FIG. 7 also illustrates values to be set for orders $ORDER_{(i+1)}$ of the comparison data $DACA_{(i+1)}$ and $DACB_{(i+1)}$. The comparison data $DACA_i$ indicates a value to be compared first, and the comparison data $DACB_i$ indicates a value to be compared after the comparison data $DACA_i$. The order $ORDER_i=0$ indicates that comparison with the higher DA conversion data $DACH_i$ is performed first and comparison with the lower DA conversion data $DACL_i$ is performed next. The order $ORDER_i=1$ indicates that comparison with the lower DA conversion data $DACL_i$ is performed first and comparison with the higher DA conversion data $DACH_i$ is performed next. The value of the initial order $ORDER_1$ may be set at, for example, 1.

In FIG. 7, when the comparison result $CMPA_i$ is 0, the comparison result $CMPB_i$ is 0, and the order $ORDER_i$ is 0, the higher DA conversion data $DACH_{(i+1)}$ is set as the comparison data $DACA_{(i+1)}$ and the lower DA conversion data $DACL_{(i+1)}$ is set as the comparison data $DACB_{(i+1)}$. Also, the next order $ORDER_{(i+1)}$ is set at 0.

When the comparison result $CMPA_i$ is 0, the comparison result $CMPB_i$ is 1, and the order $ORDER_i$ is 0, the lower DA conversion data $DACL_{(i+1)}$ is set as the comparison data $DACA_{(i+1)}$ and the higher DA conversion data $DACH_{(i+1)}$ is set as the comparison data $DACB_{(i+1)}$. In this case, the next order $ORDER_{(i+1)}$ is set at 1.

In the example of FIG. 7, the next order $ORDER_{(i+1)}$ becomes 0 when both of the comparison results $CMPA_i$ and $CMPB_i$ are 0 and the order $ORDER_i$ is 0. On the other hand, the next order $ORDER_{(i+1)}$ becomes 1 when at least one of the comparison results $CMPA_i$ and $CMPB_i$ is 1 and the order $ORDER_i$ is 0. Also, the next order $ORDER_{(i+1)}$ becomes 0 when at least one of the comparison results $CMPA_i$ and $CMPB_i$ is 0 and the order $ORDER_i$ is 1. Further, the next order $ORDER_{(i+1)}$ becomes 1 when both of the comparison results $CMPA_i$ and $CMPB_i$ are 1 and the order $ORDER_i$ is 1.

Setting the next order $ORDER_{(i+1)}$ as described above makes it possible to minimize the amount of change between the comparison data $DACB_i$ that is the second output in the previous comparison and the comparison data $DACA_{(i+1)}$ that is the first output in the next comparison, and thereby makes it possible to minimize the settling time. This in turn makes it possible to minimize the amount of charge stored in the capacitor C1 when the comparison data $DACA_{(i+1)}$ is output, and thereby makes it possible to reduce the power consumption for a conversion process.

First Embodiment

Figure 8A:
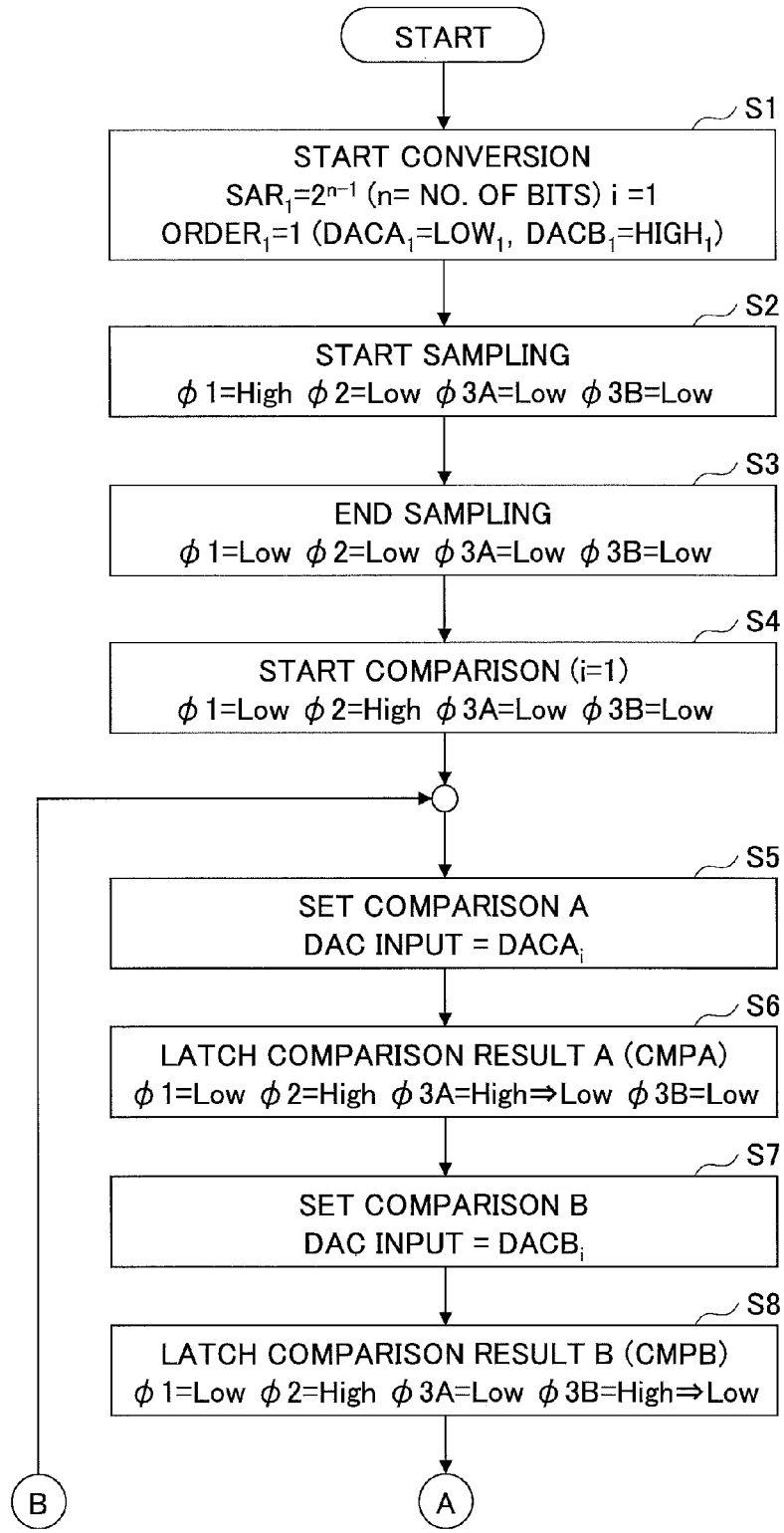
FIG. 8A is a flowchart illustrating a part of a successive approximation process according to a first embodiment.
Figure 8B:
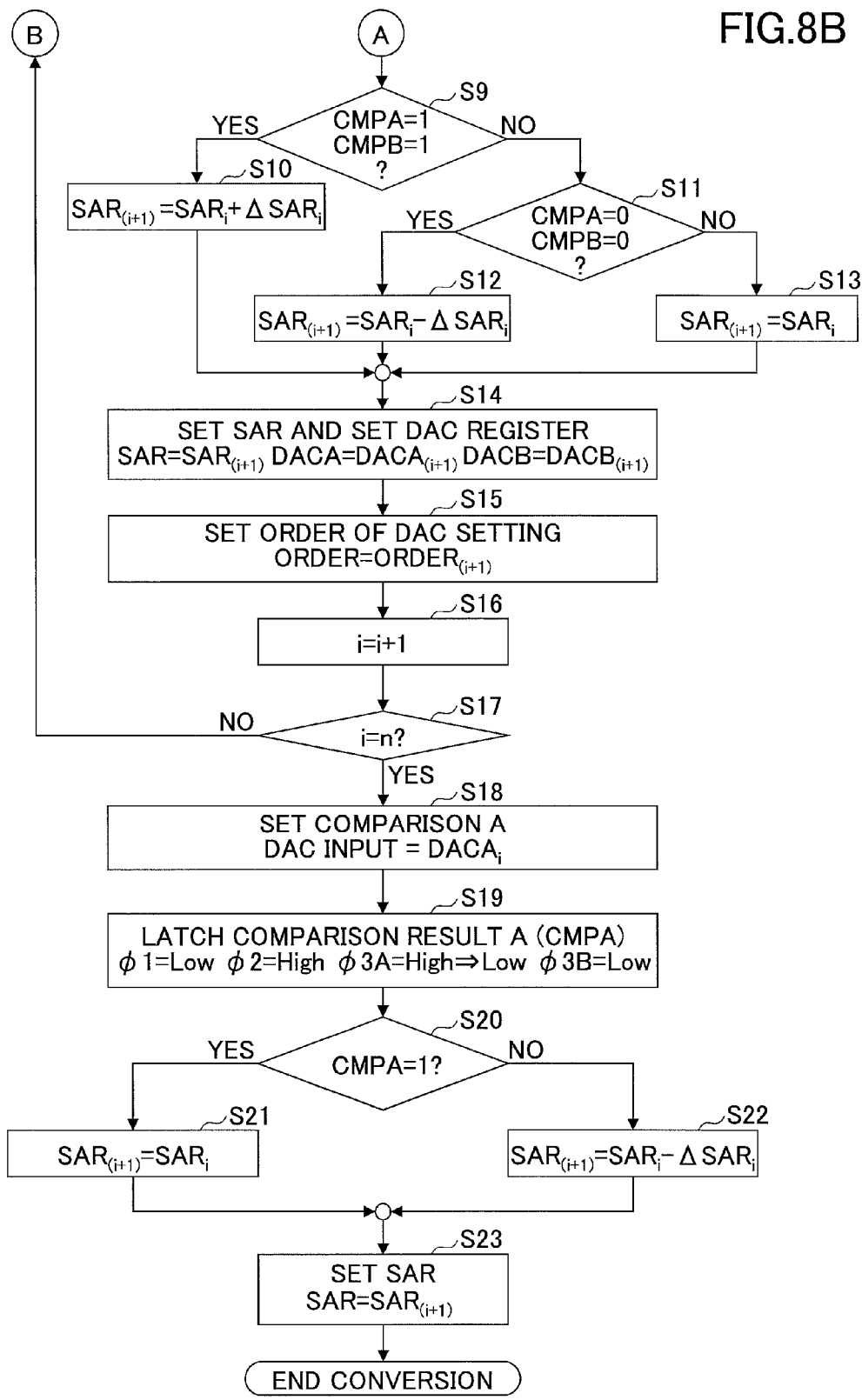
FIG. 8B is a flowchart illustrating another part of the successive approximation process according to the first embodiment.

FIGS. 8A and 8B are flowcharts illustrating a successive approximation process performed by the successive approximation register and operation unit 24 according to a first embodiment. In FIG. 8A, the successive approximation register and operation unit 24 sets "i" at 1, sets $ORDER_1$ at 1, and starts conversion at step S1. The successive approximation register and operation unit 24 starts sampling of the analog voltage Vin at step S2, and ends the sampling at step S3. Next, the successive approximation register and operation unit 24 starts comparison at step S4.

The successive approximation register and operation unit 24 supplies the comparison data $DACA_i$ to the DA converter 25 at step S5, and latches the comparison result CMPA at step S6. Then, the successive approximation register and operation unit 24 supplies the comparison data $DACB_i$ to the DA converter 25 at step S7, and latches the comparison result CMPB at step S8.

In FIG. 8B, the successive approximation register and operation unit 24 determines, at step S9, whether CMPA=1 and CMPB=1 are true. When CMPA=1 and CMPB=1 are true, the successive approximation register and operation unit 24, at step S10, sets $SAR_i+\Delta SAR_i$ as the approximate value $SAR_{(i+1)}$. When CMPA=1 and CMPB=1 are not true, the successive approximation register and operation unit 24 determines, at step S11, whether CMPA=0 and CMPB=0 are true. When CMPA=0 and CMPB=0 are true, the successive approximation register and operation unit 24, at step S12, sets $SAR_i-\Delta SAR_i$ as the approximate value $SAR_{(i+1)}$. When CMPA=0 and CMPB=0 are not true, the successive approximation register and operation unit 24, at step S13, sets $SAR_i$ as the approximate value $SAR_{(i+1)}$.

The successive approximation register and operation unit 24 sets next $SAR_{(i+1)}$, $DACA_{(i+1)}$, and $DACB_{(i+1)}$ at step S14 based on the relationships illustrated by FIGS. 6 and 7, and sets the next order $ORDER_{(i+1)}$ at step S15 based on the relationships illustrated by FIGS. 6 and 7. The successive approximation register and operation unit 24 increments "i" (i=i+1) at step S16, and determines whether i=n is true at step S17. Here, "n" indicates the number of bits of digital data to be obtained by conversion. When i=n is not true, the process proceeds to step S5 of FIG. 8A. When i=n is true, the process proceeds to step S18.

When "i" reaches "n" (i=n) and the least significant bit is processed, the successive approximation register and operation unit 24 supplies the comparison data $DACA_i$ to the DA converter 25 at step 18, and latches the comparison result CMPA at step S19. At step S20, the successive approximation register and operation unit 24 determines whether CMPA=1 is true. When CMPA=1 is true, the successive approximation register and operation unit 24 sets $SAR_i$ as $SAR_{(i+1)}$ at step S21. When CMPA=1 is not true, the successive approximation register and operation unit 24 sets $SAR_i-\Delta SAR_i$ as $SAR_{(i+1)}$ at step S22. Then, the successive approximation register and operation unit 24, at step S23, sets $SAR_{(i+1)}$ in the successive approximation register (SAR) 24c to output $SAR_{(i+1)}$ as converted digital data, and terminates the process.

Figure 9:
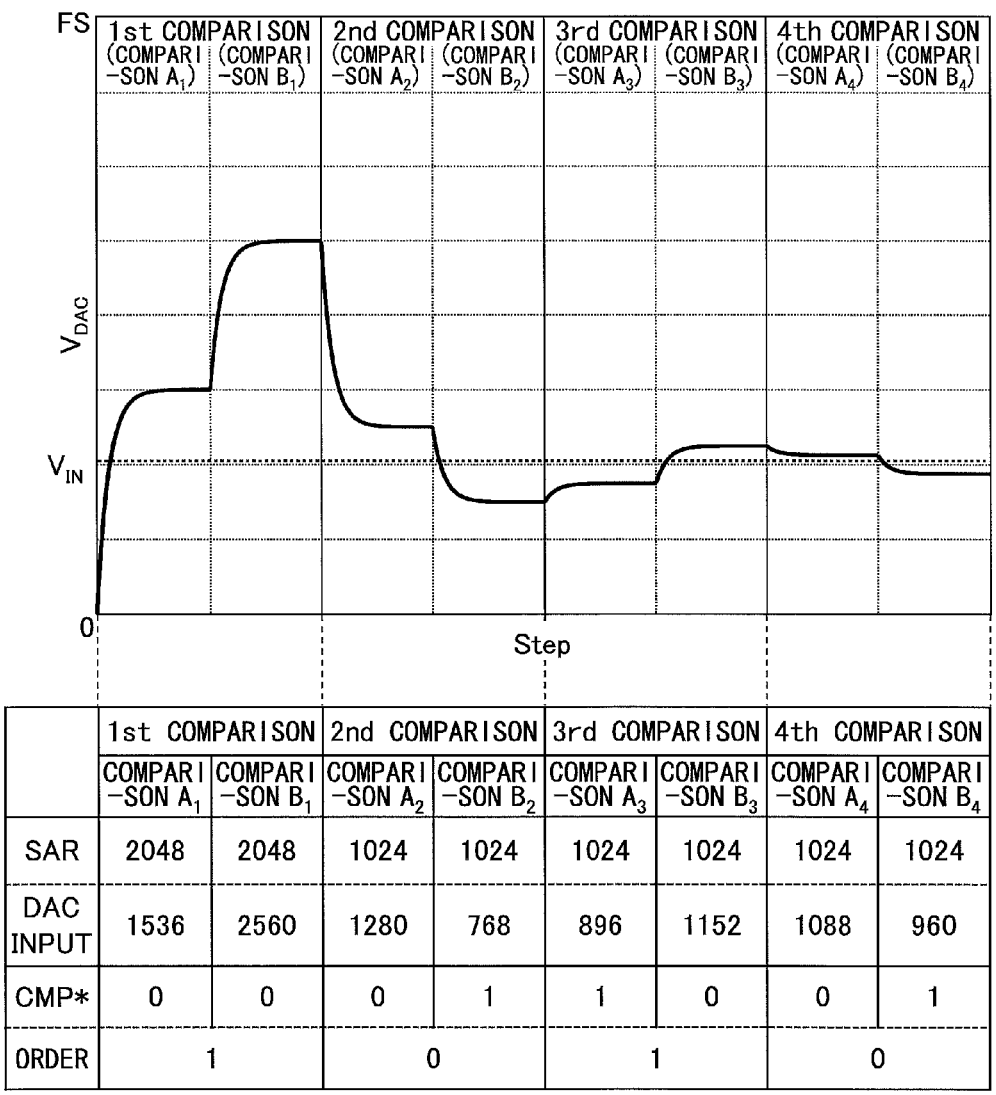
FIG. 9 is a drawing illustrating an example of an output voltage waveform of a DA converter.
Figure 10:
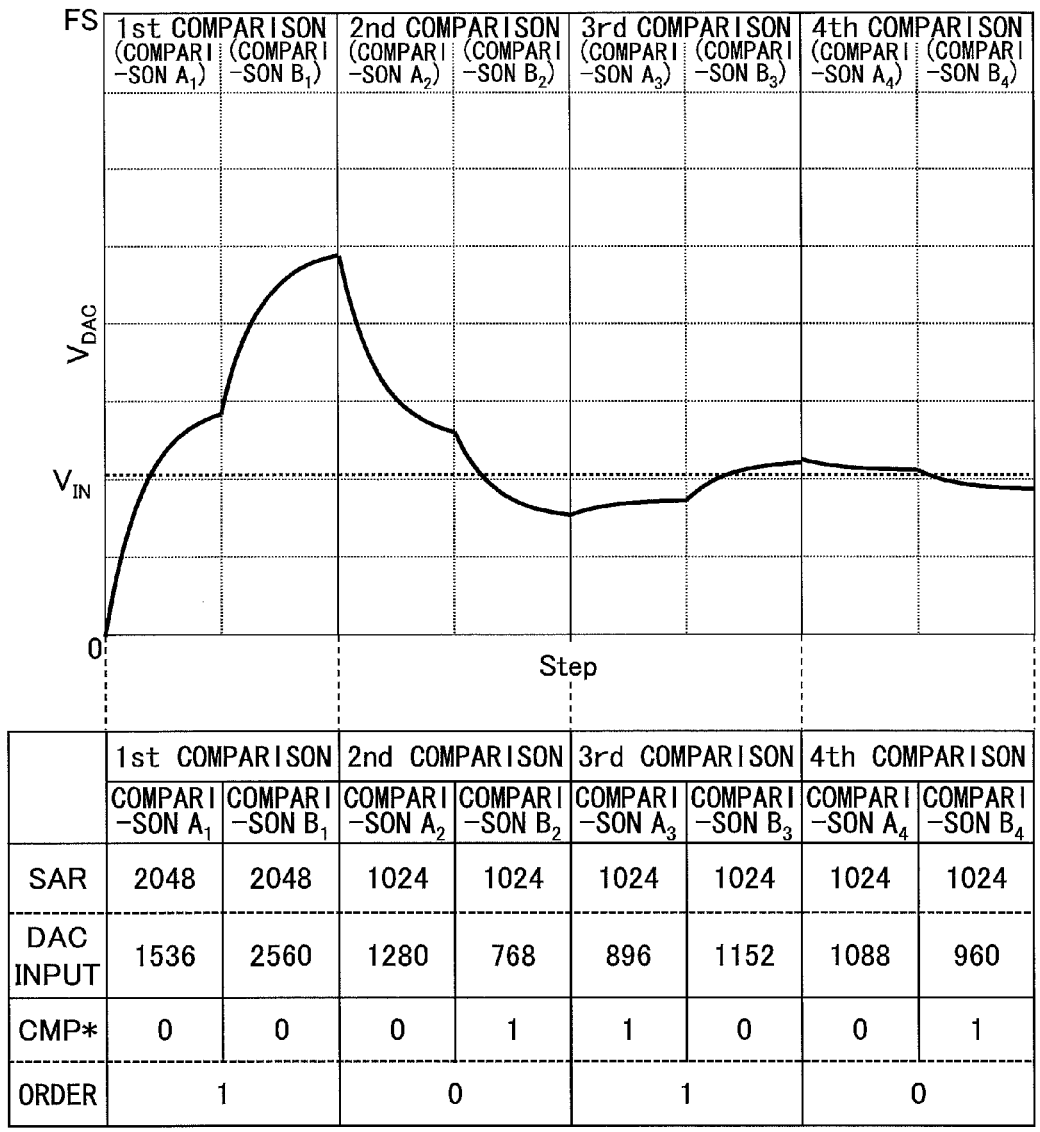
FIG. 10 is a drawing illustrating another example of an output voltage waveform of a DA converter.

FIGS. 9 and 10 are drawings illustrating exemplary voltage waveforms output by the DA converter 25 when the input voltage is Vin. FIG. 9 illustrates a case where a comparison time t is set at $10\tau$ ($\tau$ is a time constant of the sample-and-hold circuit 21), and FIG. 10 illustrates a case where the comparison time t is set at $3\tau$.

Figure 11:
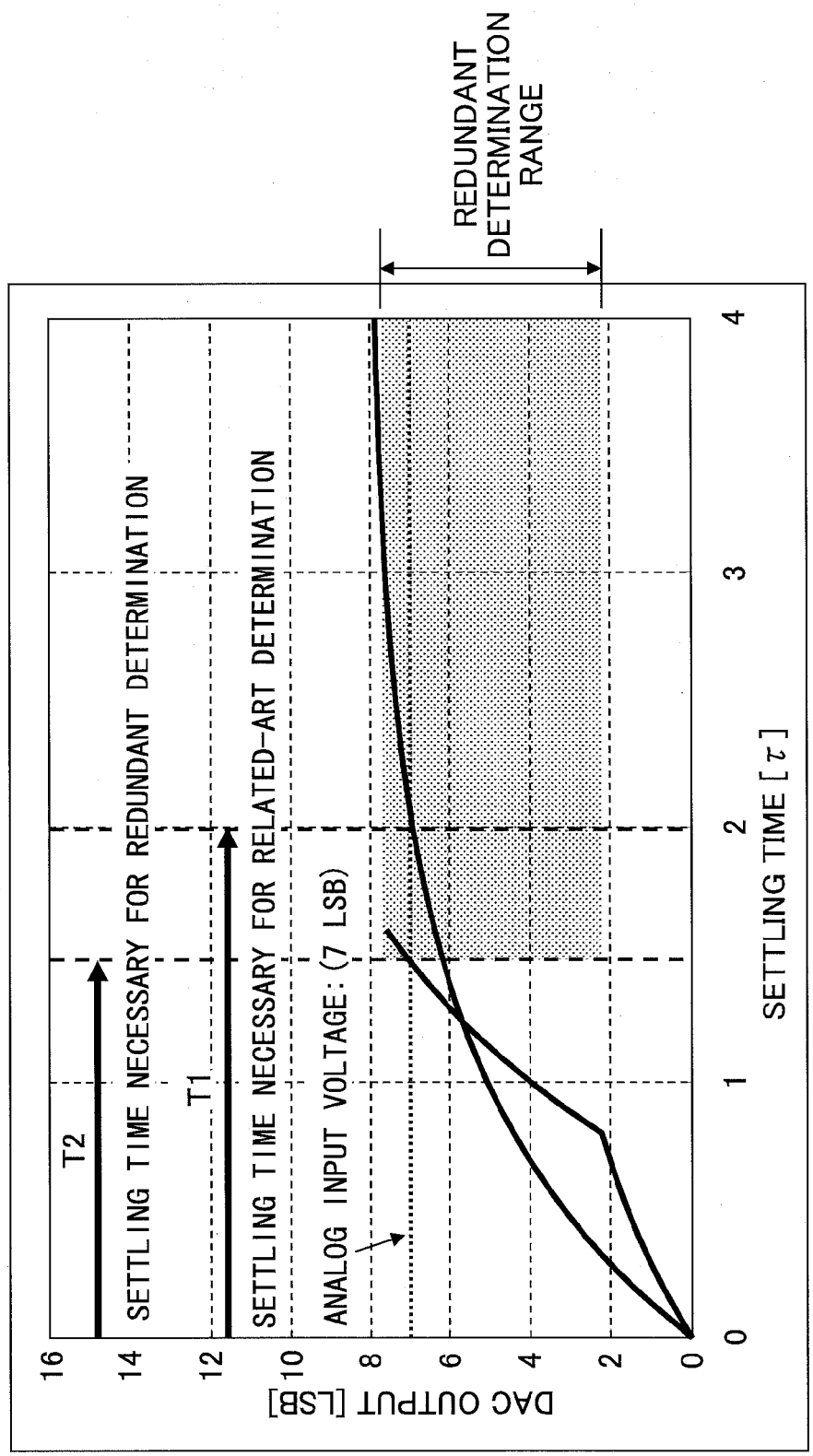
FIG. 11 is a graph used to describe settling time.

Here, with a related-art successive approximation AD conversion circuit where only one comparison point is used, settling time T1 indicated in FIG. 11 is necessary to correctly determine the output voltage of a DA converter. On the other hand, according to the present embodiment where two comparison points are used and the range between the comparison points is used as a redundant determination range, settling time can be reduced to T2 indicated in FIG. 11.

FIG. 12 is a table illustrating simulation results of conversion time for converting 12 bits according to the related art, and FIG. 13 is a table illustrating simulation results of conversion time for converting 12 bits according to the present embodiment. According to the related art, as illustrated by FIG. 12, the number of conversion operations for converting 12 bits is 13 and the total conversion time is $86.1\,\tau$ ($\tau$ is a time constant). According to the present embodiment, as illustrated by FIG. 13, the number of conversion operations for converting 12 bits is 25 and the total conversion time is $47.2\,\tau$. Thus, according to the present embodiment, although the number of conversion operations increases, the total conversion time is reduced.

As the simulation results indicate, the first embodiment makes it possible to perform accurate AD conversion at high speed. Also, the first embodiment requires only one comparator 22 and therefore eliminates the need to make uniform the comparison characteristics (including offsets) of multiple comparators.

Second Embodiment

Figure 14A:
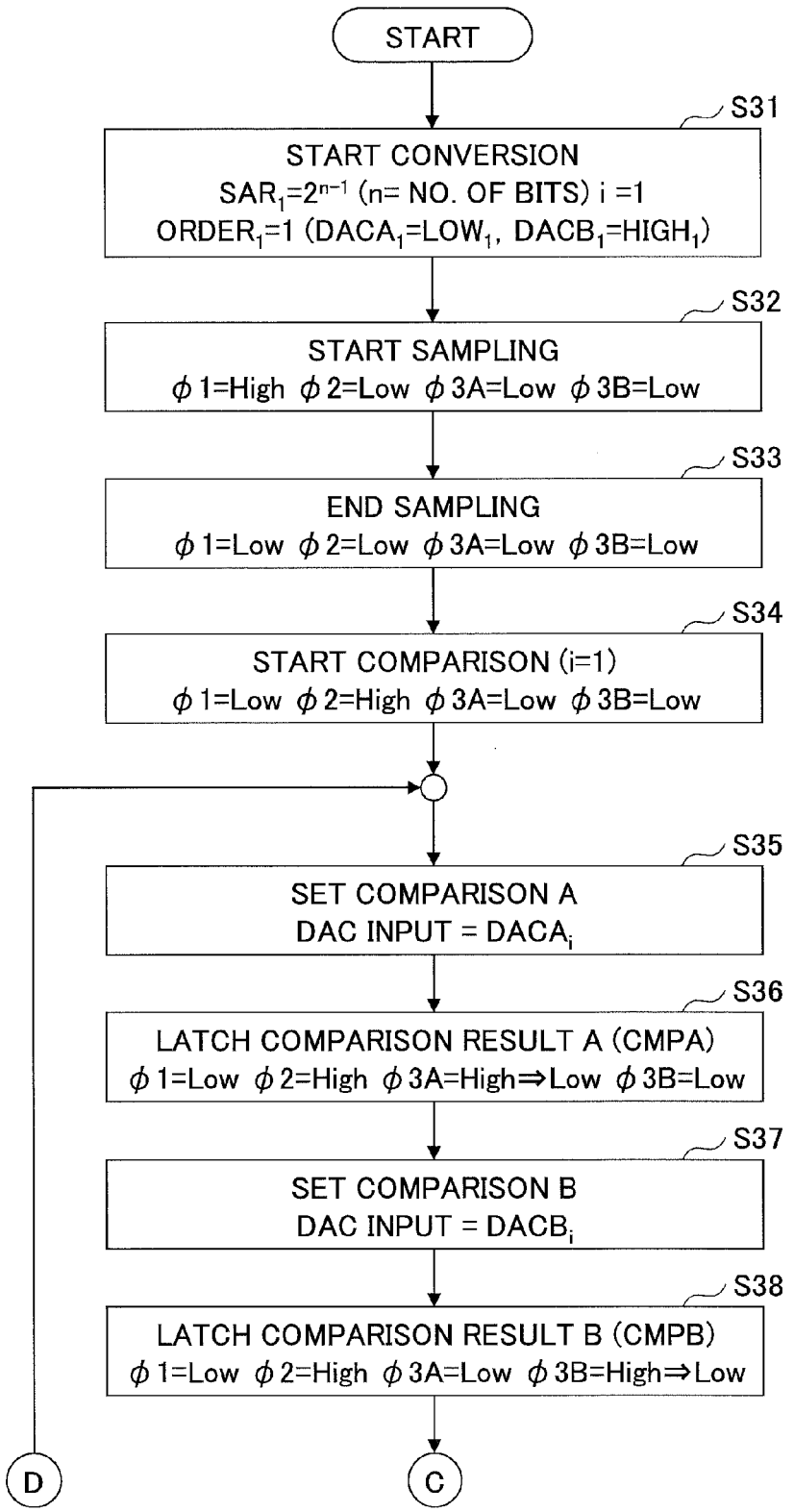
FIG. 14A is a flowchart illustrating a part of a successive approximation process according to a second embodiment.
Figure 14B:
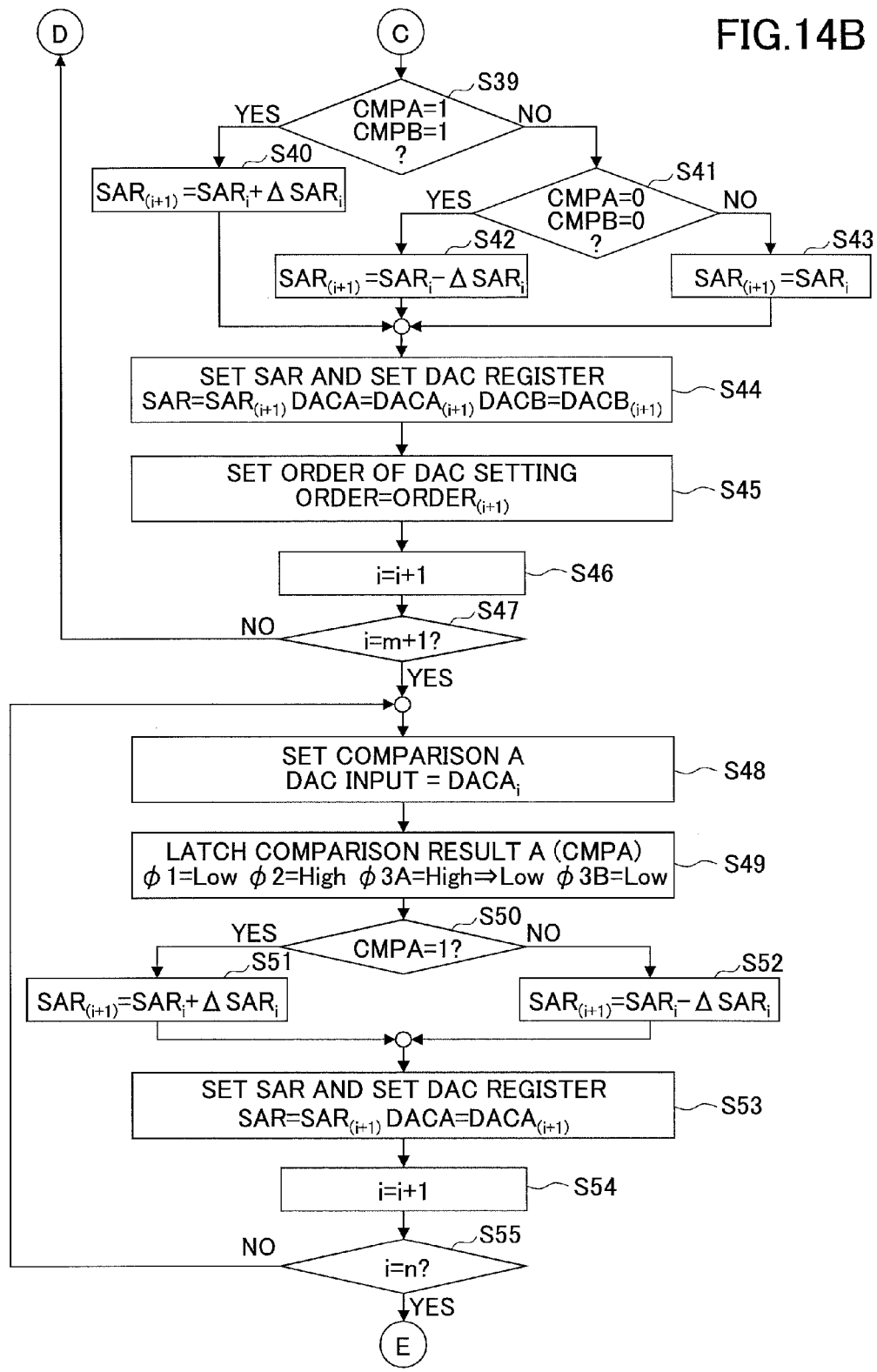
FIG. 14B is a flowchart illustrating another part of the successive approximation process according to the second embodiment.
Figure 14C:
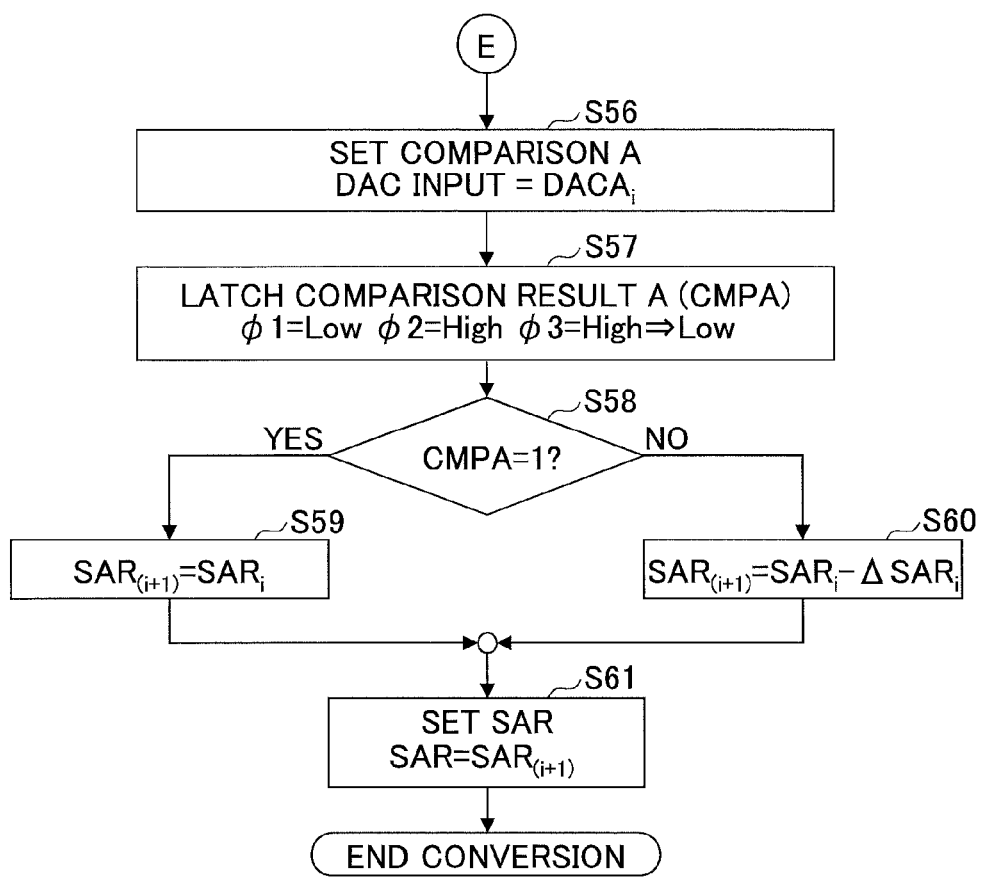
FIG. 14C is a flowchart illustrating another part of the successive approximation process according to the second embodiment.

FIGS. 14A through 14C are flowcharts illustrating a successive approximation process performed by the successive approximation register and operation unit 24 according to a second embodiment. In the second embodiment, redundant determination using two comparison points is performed for higher m bits (m≤n; e.g., 6) of 12-bit digital data, and normal determination using one comparison point is performed for lower (12-m) bits.

In FIG. 14A, the successive approximation register and operation unit 24 sets "i" at 1, sets $ORDER_1$ at 1, and starts conversion at step S31. The successive approximation register and operation unit 24 starts sampling of the analog voltage Vin at step S32, and ends the sampling at step S33. Next, the successive approximation register and operation unit 24 starts comparison at step S34.

The successive approximation register and operation unit 24 supplies the comparison data $DACA_i$ to the DA converter 25 at step S35, and latches the comparison result CMPA at step S36. Then, the successive approximation register and operation unit 24 supplies the comparison data $DACB_i$ to the DA converter 25 at step S37, and latches the comparison result CMPB at step S38.

In FIG. 14B, the successive approximation register and operation unit 24 determines, at step S39, whether CMPA=1 and CMPB=1 are true. When CMPA=1 and CMPB=1 are true, the successive approximation register and operation unit 24, at step S40, sets $SAR_i+\Delta SAR_i$ as the approximate value $SAR_{(i+1)}$. When CMPA=1 and CMPB=1 are not true, the successive approximation register and operation unit 24 determines, at step S41, whether CMPA=0 and CMPB=0 are true. When CMPA=0 and CMPB=0 are true, the successive approximation register and operation unit 24, at step S42, sets $SAR_i-\Delta SAR_i$ as the approximate value $SAR_{(i+1)}$. When CMPA=0 and CMPB=0 are not true, the successive approximation register and operation unit 24, at step S13, sets $SAR_i$ as the approximate value $SAR_{(i+1)}$.

The successive approximation register and operation unit 24 sets next $SAR_{(i+1)}$, $DACA_{(i+1)}$, and $DACB_{(i+1)}$ at step S44 based on the relationships illustrated by FIGS. 6 and 7, and sets the next order $ORDER_{(i+1)}$ at step S45 based on the relationships illustrated by FIGS. 6 and 7. The successive approximation register and operation unit 24 increments "i" (i=i+1) at step S46, and determines whether i=m+1 is true at step S47. When i=m+1 is not true, the process proceeds to step S35 of FIG. 14A. When i=m+1 is true, the process proceeds to step S48.

The successive approximation register and operation unit 24 supplies the comparison data $DACA_i$ to the DA converter 25 at step S48, and latches the comparison result CMPA at step S49. At step S50, the successive approximation register and operation unit 24 determines whether CMPA=1 is true. When CMPA=1 is true, the successive approximation register and operation unit 24 sets $SAR_i+\Delta SAR_i$ as $SAR_{(i+1)}$ at step S51. When CMPA=1 is not true, the successive approximation register and operation unit 24 sets $SAR_i-\Delta SAR_i$ as $SAR_{(i+1)}$ at step S52. At step S53, the successive approximation register and operation unit 24 sets next $SAR_{(i+1)}$ and $DACA_{(i+1)}$ at step S53 based on the relationships illustrated by FIGS. 6 and 7. Then, the successive approximation register and operation unit 24 increments "i" (i=i+1) at step S55, and determines whether i=n is true at step S55. When i=n is not true, the process proceeds to step S48. When i=n is true, the process proceeds to step S56 of FIG. 14C.

The successive approximation register and operation unit 24 supplies the comparison data $DACA_i$ to the DA converter 25 at step S56, and latches the comparison result CMPA at step S57. At step S58, the successive approximation register and operation unit 24 determines whether CMPA=1 is true. When CMPA=1 is true, the successive approximation register and operation unit 24 sets $SAR_i$ as $SAR_{(i+1)}$ at step S59. When CMPA=1 is not true, the successive approximation register and operation unit 24 sets $SAR_i-\Delta SAR_i$ as $SAR_{(i+1)}$ at step S60. Then, the successive approximation register and operation unit 24, at step S61, sets $SAR_{(i+1)}$ in the successive approximation register (SAR) 24c to output $SAR_{(i+1)}$ as converted digital data, and terminates the process.

In the second embodiment, normal determination using one comparison point is performed for the lower (12-m) bits where the variation of the approximate value SAR, i.e., the variation in the output voltage of the DA converter 25, becomes smaller than that in the higher m bits. Accordingly, compared with the first embodiment, the second embodiment makes it possible to reduce the number of comparison operations and the total conversion time.

Third Embodiment

FIGS. 15A through 15d are flowcharts illustrating a successive approximation process performed by the successive approximation register and operation unit 24 according to a third embodiment. In the third embodiment, after performing redundant determination for higher m bits of 12-bit digital data, redundant determination is repeated x (e.g., 4) times for lower (12-m) bits using SAR obtained in the redundant determination for the higher m bits and the determination results are averaged to improve the accuracy of redundant determination.

Figure 15A:
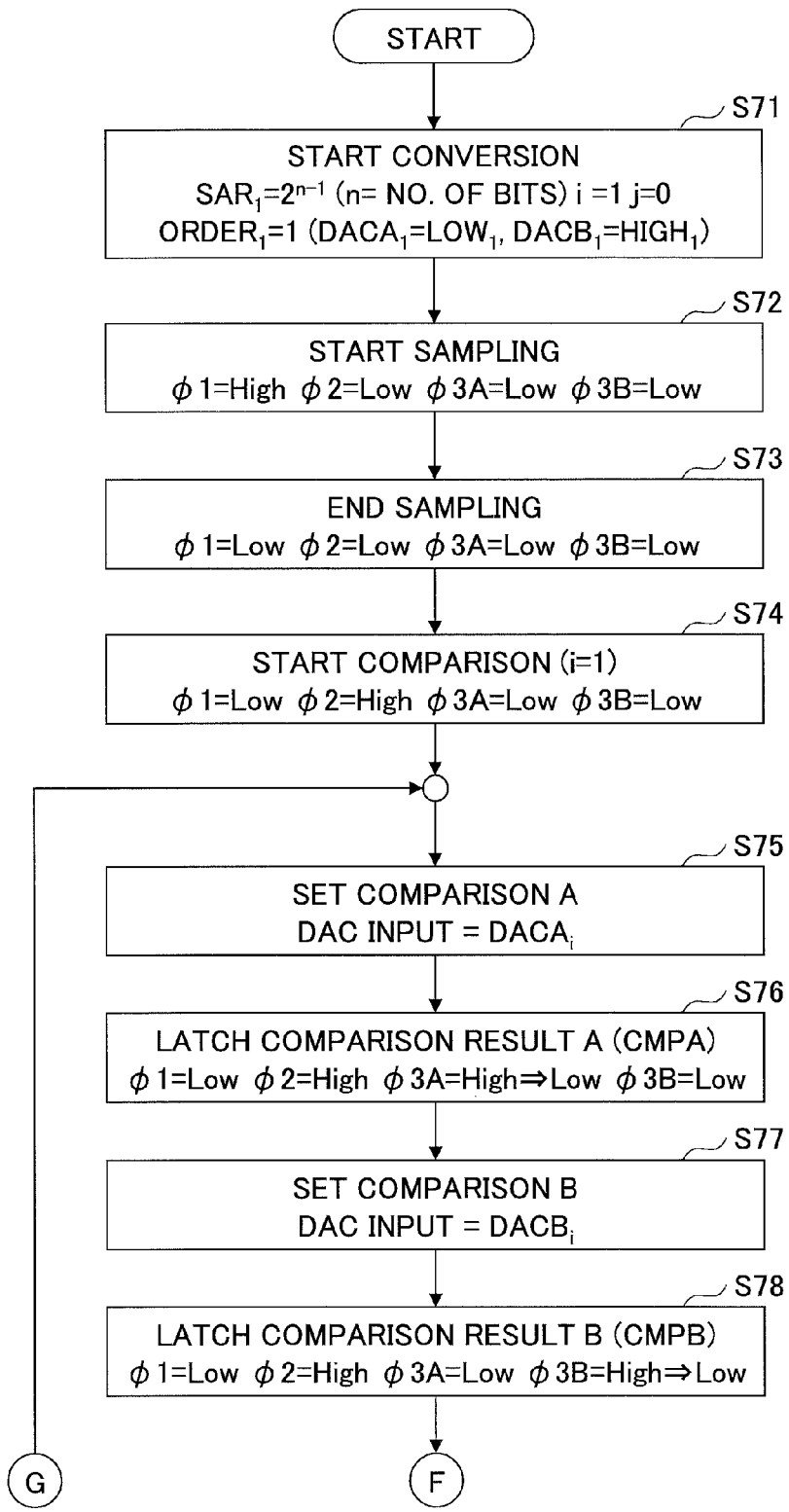
FIG. 15A is a flowchart illustrating a part of a successive approximation process according to a third embodiment.

In FIG. 15A, the successive approximation register and operation unit 24 sets "i" at 1, sets "j" at 0, sets $ORDER_1$ at 1, and starts conversion at step S71. The successive approximation register and operation unit 24 starts sampling of the analog voltage Vin at step S72, and ends the sampling at step S73. Next, the successive approximation register and operation unit 24 starts comparison at step S74.

The successive approximation register and operation unit 24 supplies the comparison data $DACA_i$ to the DA converter 25 at step S75, and latches the comparison result CMPA at step S76. Then, the successive approximation register and operation unit 24 supplies the comparison data $DACB_i$ to the DA converter 25 at step S77, and latches the comparison result CMPB at step S78.

Figure 15B:
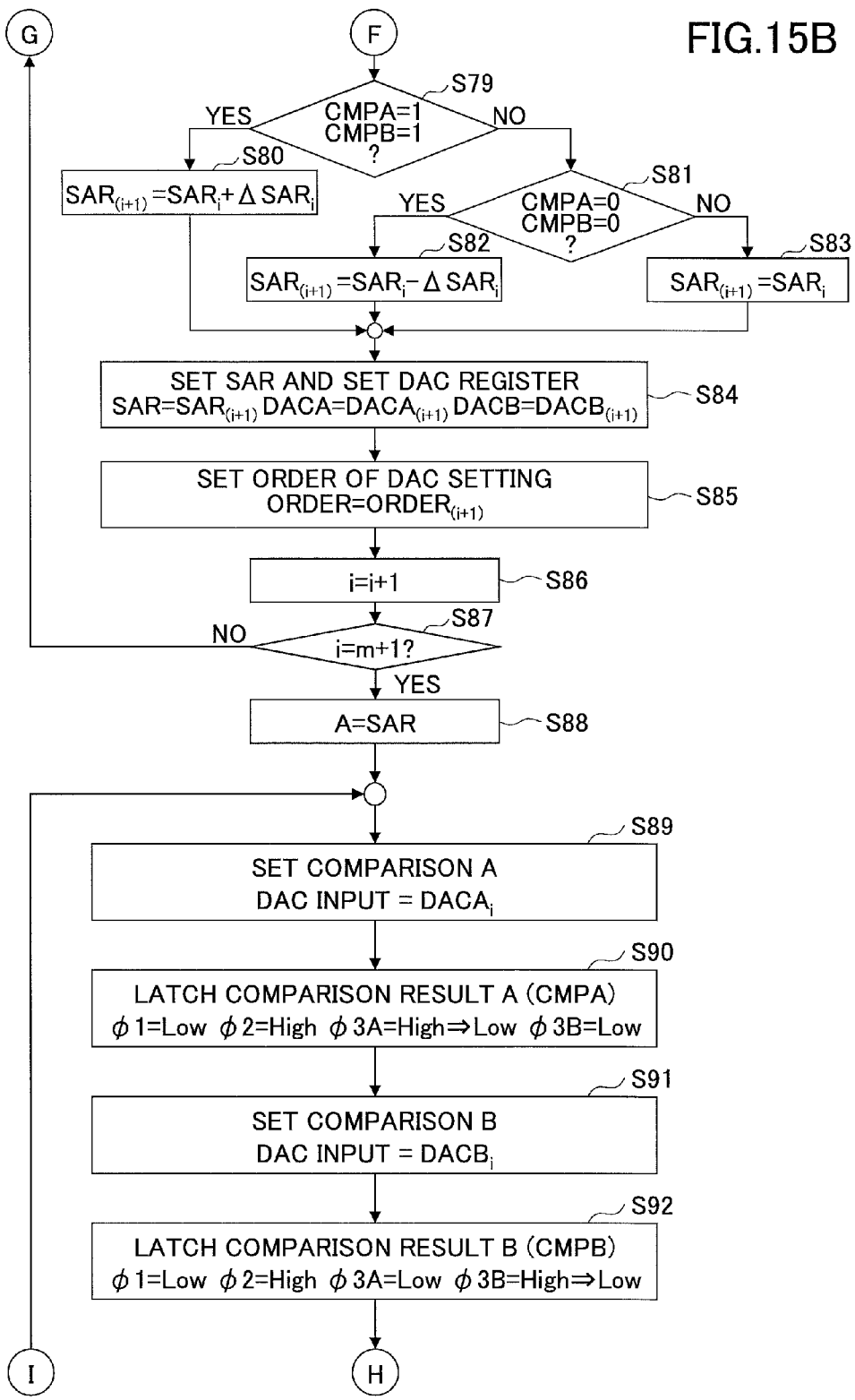
FIG. 15B is a flowchart illustrating another part of the successive approximation process according to the third embodiment.

In FIG. 15B, the successive approximation register and operation unit 24 determines, at step S79, whether CMPA=1 and CMPB=1 are true. When CMPA=1 and CMPB=1 are true, the successive approximation register and operation unit 24, at step S80, sets $SAR_i+\Delta SAR_i$ as the approximate value $SAR_{(i+1)}$. When CMPA=1 and CMPB=1 are not true, the successive approximation register and operation unit 24 determines, at step S81, whether CMPA=0 and CMPB=0 are true. When CMPA=0 and CMPB=0 are true, the successive approximation register and operation unit 24, at step S82, sets $SAR_i-\Delta SAR_i$ as the approximate value $SAR_{(i+1)}$. When CMPA=0 and CMPB=0 are not true, the successive approximation register and operation unit 24, at step S83, sets $SAR_i$ as the approximate value $SAR_{(i+1)}$.

The successive approximation register and operation unit 24 sets next $SAR_{(i+1)}$, $DACA_{(i+1)}$, and $DACB_{(i+1)}$ at step S84 based on the relationships illustrated by FIGS. 6 and 7, and sets the next order $ORDER_{(i+1)}$ at step S85 based on the relationships illustrated by FIGS. 6 and 7. The successive approximation register and operation unit 24 increments "i" (i=i+1) at step S86, and determines whether i=m+1 is true at step S87. When i=m+1 is not true, the process proceeds to step S75 of FIG. 15A. When i=m+1 is true, the process proceeds to step S88.

At step S88, the successive approximation register and operation unit 24 saves $SAR_{(i+1)}$, which is a comparison result of the higher m bits, in a variable A. The successive approximation register and operation unit supplies the comparison data $DACA_i$ to the DA converter 25 at step S89, and latches the comparison result CMPA at step S90. Then, the successive approximation register and operation unit 24 supplies the comparison data $DACB_i$ to the DA converter 25 at step S91, and latches the comparison result CMPB at step S92.

Figure 15C:
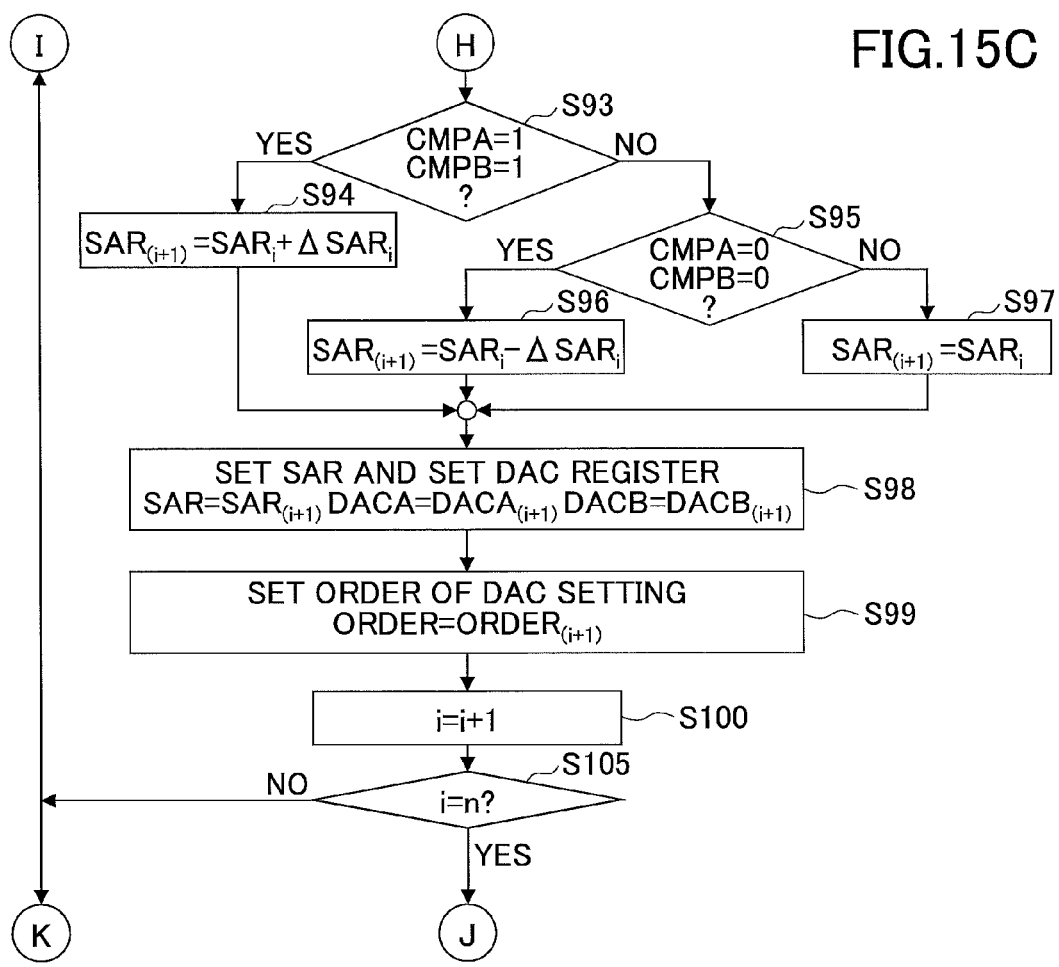
FIG. 15C is a flowchart illustrating another part of the successive approximation process according to the third embodiment.

At step S93 of FIG. 15C, the successive approximation register and operation unit 24 determines whether CMPA=1 and CMPB=1 are true. When CMPA=1 and CMPB=1 are true, the successive approximation register and operation unit 24, at step S94, sets $SAR_i+\Delta SAR_i$ as the approximate value $SAR_{(i+1)}$. When CMPA=1 and CMPB=1 are not true, the successive approximation register and operation unit 24 determines, at step S95, whether CMPA=0 and CMPB=0 are true. When CMPA=0 and CMPB=0 are true, the successive approximation register and operation unit 24, at step S96, sets $SAR_i-\Delta SAR_i$ as the approximate value $SAR_{(i+1)}$. When CMPA=0 and CMPB=0 are not true, the successive approximation register and operation unit 24, at step S97, sets $SAR_i$ as the approximate value $SAR_{(i+1)}$.

The successive approximation register and operation unit 24 sets next $SAR_{(i+1)}$, $DACA_{(i+1)}$, and $DACB_{(i+1)}$ at step S98 based on the relationships illustrated by FIGS. 6 and 7, and sets the next order $ORDER_{(i+1)}$ at step S99 based on the relationships illustrated by FIGS. 6 and 7. The successive approximation register and operation unit 24 increments "i" (i=i+1) at step S100, and determines whether i=n is true at step S101. When i=n is not true, the process proceeds to step S89 of FIG. 15B. When i=n is true, the process proceeds to step S106 of FIG. 15D.

Figure 15D:
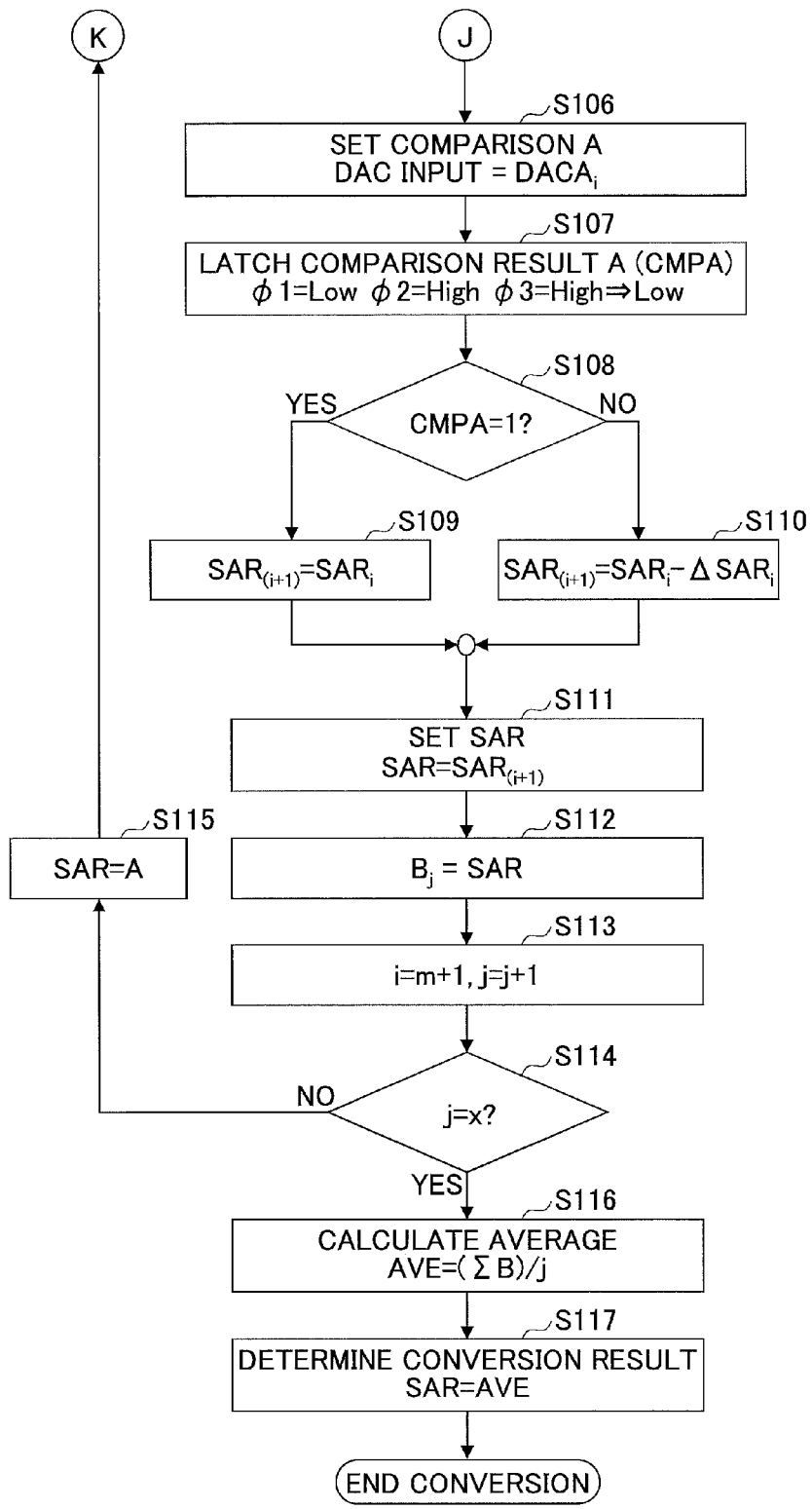
FIG. 15D is a flowchart illustrating another part of the successive approximation process according to the third embodiment.

The successive approximation register and operation unit 24 supplies the comparison data $DACA_i$ to the DA converter 25 at step S106 of FIG. 15D, and latches the comparison result CMPA at step S107. At step S108, the successive approximation register and operation unit 24 determines whether CMPA=1 is true. When CMPA=1 is true, the successive approximation register and operation unit 24 sets $SAR_i$ as $SAR_{(i+1)}$ at step S109. When CMPA=1 is not true, the successive approximation register and operation unit 24 sets $SAR_i-\Delta SAR_i$ as $SAR_{(i+1)}$ at step S110.

The successive approximation register and operation unit 24 sets $SAR_{(i+1)}$ in a variable SAR at step S111, and sets the value of the variable SAR in a variable $B_j$ at step S112. At step S113, the successive approximation register and operation unit 24 sets "i" at "m+1" (i=m+1) and increments "j" (j=j+1). Then, the successive approximation register and operation unit 24 determines, at step S114, whether j=x is true. When j=x is not true, the successive approximation register and operation unit 24 sets the comparison result of the higher m bits, which is saved in the variable A, in the variable SAR, and proceeds to step S89. On the other hand, when j=x is true, the successive approximation register and operation unit 24 calculates an average AVE of the total of $B_1$ through $B_x$ at step S116. Then, the successive approximation register and operation unit 24 sets the average AVE in the successive approximation register (SAR) 24c to output the average AVE as converted digital data, and terminates the process.

Figure 16A:
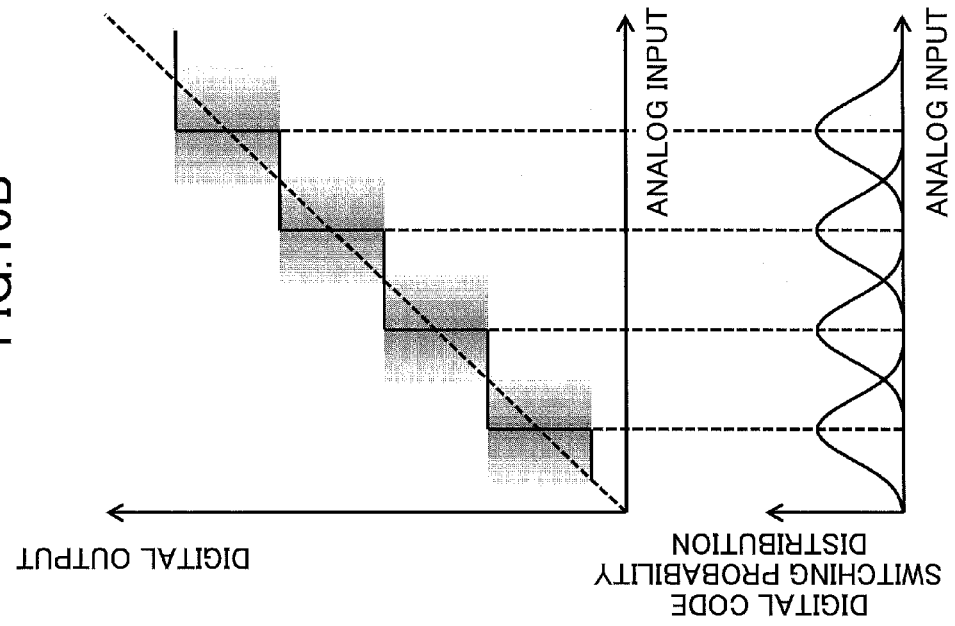
FIG. 16A is a drawing illustrating an exemplary switching probability distribution of an analog input and a digital output.
Figure 16B:
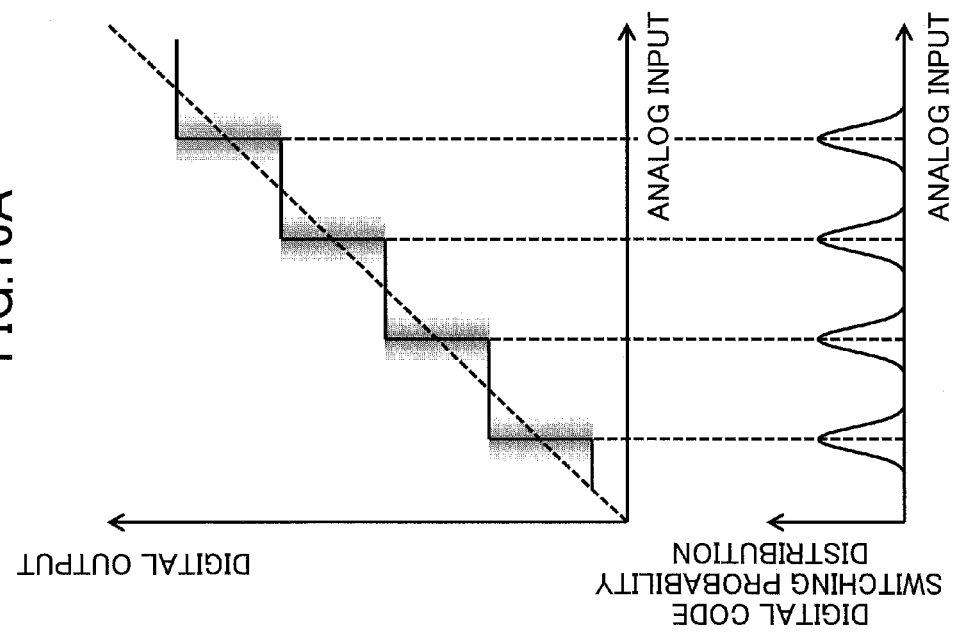
FIG. 16B is a drawing illustrating another exemplary switching probability distribution of an analog input and a digital output.

When the switching probability distribution of an analog input and a digital output is concentrated on a switching point as illustrated by FIG. 16A, the accuracy of redundant determination is good. On the other hand, when the switching probability distribution of an analog input and a digital output is not concentrated on a switching point as illustrated by FIG. 16B, the accuracy of redundant determination is degraded. The third embodiment makes it possible to prevent the degradation of the accuracy of redundant determination.

Steps S112, S116, and S117 of FIG. 15D may be changed below. For example, at step S112, instead of setting the value of the variable SAR in the variable $B_j$, a difference between the value of the variable SAR and the value of the variable A may be set in the variable $B_j$. Also, an average $\Delta$AVE of the total of differences $B_1$ through $B_x$ may be obtained at step S116, and a value obtained by adding the average $\Delta$AVE to the value of the variable A may be set in the successive approximation register (SAR) 24c at step S117 and output as converted digital data.

Thus, according to the third embodiment, redundant determination is repeated x times for the lower (12-m) bits and the determination results are averaged to improve the noise tolerance and the accuracy of redundant determination.

Steps S89 through S105 of the third embodiment may be replaced with steps S48 through S55 of the second embodiment.

<Variation of Circuit Configuration>

Figure 17:
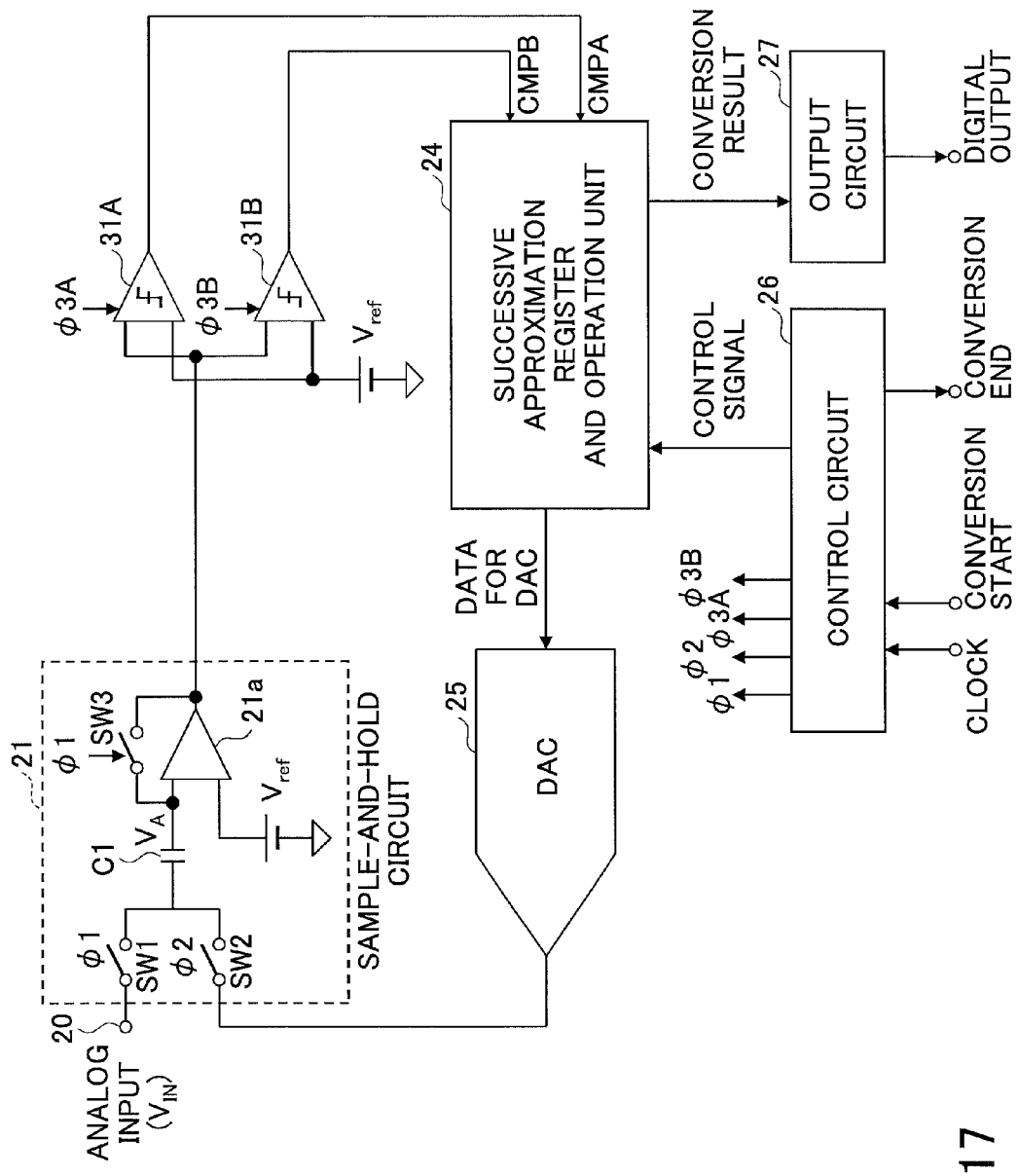
FIG. 17 is a circuit diagram illustrating a variation of the successive approximation AD converter of FIG. 1.
Figure 18:
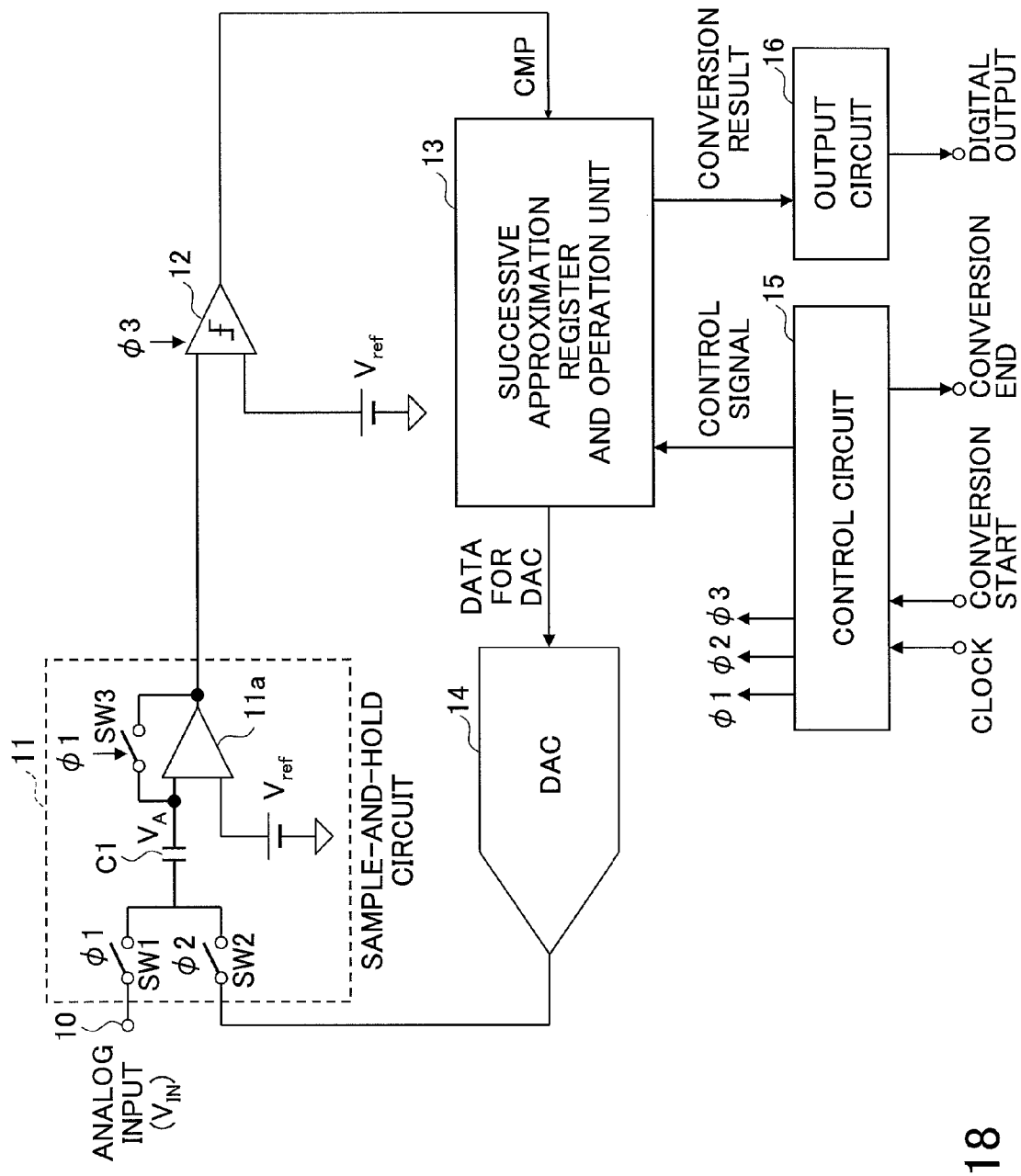
FIG. 18 is a circuit diagram illustrating a configuration of a related-art successive approximation AD converter.

FIG. 17 is a circuit diagram illustrating a variation of the successive approximation AD converter of FIG. 1. In FIG. 17, an analog voltage Vin is input to an input terminal 20. A sample-and-hold circuit 21 samples and holds the analog voltage Vin or a voltage difference between the analog voltage Vin and an output voltage of a DA converter (DAC) 25 with reference to a reference voltage Vref.

A dynamic latch comparator 31A has a hysteresis characteristic. The dynamic latch comparator 31A compares an output voltage of the sample-and-hold circuit 21 with the reference voltage Vref and generates a comparison result that becomes 1 when the voltage difference between the analog voltage Vin and the output voltage of the DA converter 25 is greater than the reference voltage Vref and becomes 0 when the voltage difference is less than the reference voltage Vref. The dynamic latch comparator 31A latches the comparison result (CMPA) and supplies the latched comparison result to a successive approximation register and operation unit 24 when the value of a timing signal φ3A is 1.

A dynamic latch comparator 31B has a hysteresis characteristic. The dynamic latch comparator 31B compares an output voltage of the sample-and-hold circuit 21 with the reference voltage Vref and generates a comparison result that becomes 1 when the voltage difference between the analog voltage Vin and the output voltage of the DA converter 25 is greater than the reference voltage Vref and becomes 0 when the voltage difference is less than the reference voltage Vref. The dynamic latch comparator 31B latches the comparison result (CMPB) and supplies the latched comparison result to the successive approximation register and operation unit 24 when the value of a timing signal φ3B is 1.

The successive approximation register and operation unit 24 determines the corresponding bit based on the comparison results supplied from the dynamic latch comparators 31A and 31B, generates next DA conversion data, supplies the next DA conversion data as comparison data to the DA converter 25, and supplies a final conversion result to an output circuit 27.

A control circuit 26 receives a clock signal and a conversion start command from the outside, generates timing signals φ1, φ2, φ3A, and φ3B, supplies the timing signals φ1, φ2, φ3A, and φ3B to the sample-and-hold circuit 21 and the dynamic latch comparators 31A and 31B, generates a control signal indicating a start or an end, and supplies the control signal to the successive approximation register and operation unit 24. The control circuit 26 also outputs a conversion end command to the outside. The output circuit 27 outputs digital data representing the final conversion result (final approximate value).

An aspect of this disclosure provides a successive approximation AD converter and a successive approximation AD conversion method that make it possible to perform accurate AD conversion at high speed.

A successive approximation AD converter and a successive approximation AD conversion method are described above as preferred embodiments. However, the present invention is not limited to the specifically disclosed embodiments, and variations and modifications may be made without departing from the scope of the present invention.

What is claimed is:

1. A successive approximation AD converter, comprising:
    a DA converter that converts a higher conversion data greater than an approximate value into an analog higher converted voltage and converts a lower conversion data less than the approximate value into an analog lower converted voltage;
    a sample-and-hold circuit that samples and holds voltage differences between an input voltage input from an outside and each of the higher converted voltage and the lower converted voltage;
    a comparator that outputs, based on the voltage differences output from the sample-and-hold circuit, a first comparison result indicating whether the input voltage is greater or less than the higher converted voltage and a second comparison result indicating whether the input voltage is greater or less than the lower converted voltage; and
    an operation unit that changes the approximate value based on the first comparison result and the second comparison result, changes a next higher conversion data and a next lower conversion data based on the changed approximate value, and outputs the changed next higher conversion data and next lower conversion data to the DA converter,
    wherein the successive approximation AD converter is configured such that operations of the DA converter, the sample-and-hold circuit, the comparator, and the operation unit are repeated to obtain a final approximate value that is output as AD converted data; and
    wherein the operation unit determines a next order that indicates whether the next higher conversion data or the next lower conversion data is to be output first to the DA converter, based on the first comparison result, the second comparison result, and a previous order that indicates whether the higher conversion data or the lower conversion data was output first.

2. The successive approximation AD converter as claimed in claim 1,
    wherein when the first and second comparison results indicate that the input voltage is less than both of the higher converted voltage and the lower converted voltage, and the higher conversion data has been output before the lower conversion data in the previous order, the operation unit determines the next order such that the next higher conversion data is output before the next lower conversion data;
    wherein when the first and second comparison results indicate that the input voltage is greater than at least one of the higher converted voltage and the lower converted voltage, and the higher conversion data has been output before the lower conversion data in the previous order, the operation unit determines the next order such that the next lower conversion data is output before the next higher conversion data;
    wherein when the first and second comparison results indicate that the input voltage is less than at least one of the higher converted voltage and the lower converted voltage, and the lower conversion data has been output before the higher conversion data in the previous order, the operation unit determines the next order such that the next higher conversion data is output before the next lower conversion data; and
    wherein when the first and second comparison results indicate that the input voltage is greater than both of the higher converted voltage and the lower converted voltage, and the lower conversion data has been output before the higher conversion data in the previous order, the operation unit determines the next order such that the next lower conversion data is output before the next higher conversion data.

3. The successive approximation AD converter as claimed in claim 1, wherein the operation unit sets an amount of change from the changed approximate value to each of the next higher conversion data and the lower conversion data at a value that is less than or equal to one half of an amount of change of the changed approximate value.

4. The successive approximation AD converter as claimed in claim 1, wherein for lower bits of a plurality of bits representing the approximate value,
- the DA converter converts, instead of the higher conversion data and the lower conversion data, the approximate value into an analog converted voltage,
- the sample-and-hold circuit samples and holds a voltage difference between the input voltage and the converted voltage of the approximate value, instead of the voltage differences between the input voltage and each of the higher converted voltage and the lower converted voltage,
- the comparator outputs, instead of the first and second comparison results, a third comparison result indicating whether the input voltage is greater or less than the converted voltage of the approximate value, and
- the operation unit changes the approximate value based on the third comparison result instead of the first and second comparison results.

5. The successive approximation AD converter as claimed in claim 1, wherein the successive approximation AD converter is configured such that a process performed by the DA converter, the sample-and-hold circuit, the comparator, and the operation unit is repeated multiple times for lower bits of a plurality of bits representing the approximate value to obtain a plurality of final approximate values, and an average of the final approximate values is output as the AD converted data.

6. A successive approximation AD conversion method performed by a successive approximation AD converter, the method comprising:
- converting a higher conversion data greater than an approximate value into an analog higher converted voltage and converting a lower conversion data less than the approximate value into an analog lower converted voltage by a DA converter of the successive approximation AD converter;
- sampling and holding voltage differences between an input voltage input from an outside and each of the higher converted voltage and the lower converted voltage;
- outputting, based on the voltage differences, a first comparison result indicating whether the input voltage is greater or less than the higher converted voltage and a second comparison result indicating whether the input voltage is greater or less than the lower converted voltage; and
- changing the approximate value based on the first comparison result and the second comparison result, and changing a next higher conversion data and a next lower conversion data, which are to be output to the DA converter, based on the changed approximate value,
- wherein the converting, the sampling and holding, the outputting, and the changing are repeated to obtain a final approximate value that is output as AD converted data; and
- wherein a next order that indicates whether the next higher conversion data or the next lower conversion data is to be output first to the DA converter is determined, based on the first comparison result, the second comparison result, and a previous order that indicates whether the higher conversion data or the lower conversion data was output first.

7. The successive approximation AD conversion method as claimed in claim 6,
- wherein when the first and second comparison results indicate that the input voltage is less than both of the higher converted voltage and the lower converted voltage, and the higher conversion data has been output before the lower conversion data in the previous order, the next order is determined such that the next higher conversion data is output before the next lower conversion data;
- wherein when the first and second comparison results indicate that the input voltage is greater than at least one of the higher converted voltage and the lower converted voltage, and the higher conversion data has been output before the lower conversion data in the previous order, the next order is determined such that the next lower conversion data is output before the next higher conversion data;
- wherein when the first and second comparison results indicate that the input voltage is less than at least one of the higher converted voltage and the lower converted voltage, and the lower conversion data has been output before the higher conversion data in the previous order, the next order is determined such that the next higher conversion data is output before the next lower conversion data; and
- wherein when the first and second comparison results indicate that the input voltage is greater than both of the higher converted voltage and the lower converted voltage, and the lower conversion data has been output before the higher conversion data in the previous order, the next order is determined such that the next lower conversion data is output before the next higher conversion data.

8. The successive approximation AD conversion method as claimed in claim 6, wherein an amount of change from the changed approximate value to each of the next higher conversion data and the lower conversion data is set at a value that is less than or equal to one half of an amount of change of the changed approximate value.

9. The successive approximation AD conversion method as claimed in claim 6, wherein for lower bits of a plurality of bits representing the approximate value,
- instead of the higher conversion data and the lower conversion data, the approximate value is converted into an analog converted voltage,
- instead of the voltage differences between the input voltage and each of the higher converted voltage and the lower converted voltage, a voltage difference between the input voltage and the converted voltage of the approximate value is sampled and held,
- instead of the first and second comparison results, a third comparison result indicating whether the input voltage is greater or less than the converted voltage of the approximate value is output, and
- the approximate value is changed based on the third comparison result instead of the first and second comparison results.

10. The successive approximation AD conversion method as claimed in claim 6, wherein a process including the converting, the sampling and holding, the outputting, and the changing is repeated multiple times for lower bits of a plurality of bits representing the approximate value to obtain a plurality of final approximate values, and an average of the final approximate values is output as the AD converted data.

* * * * *